(12) United States Patent
Doyle et al.

(10) Patent No.: US 11,641,413 B2
(45) Date of Patent: *May 2, 2023

(54) MODULE IDENTIFICATION METHOD FOR EXPANDABLE GATEWAY APPLICATIONS

(71) Applicant: Veea Inc., New York, NY (US)

(72) Inventors: Dave Doyle, New York, NY (US); Perry Wintner, New York, NY (US); Michael Liccone, New York, NY (US); Michael Mirabella, New York, NY (US); Bob Migliorino, New York, NY (US); Shaun Greaney, New York, NY (US); Theodore Lubbe, New York, NY (US); Clint Smith, New York, NY (US)

(73) Assignee: VEEA INC., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/577,642

(22) Filed: Jan. 18, 2022

(65) Prior Publication Data

US 2022/0141324 A1 May 5, 2022

Related U.S. Application Data

(63) Continuation of application No. 17/158,266, filed on Jan. 26, 2021, now Pat. No. 11,258,889.

(Continued)

(51) Int. Cl.
*H04M 1/02* (2006.01)
*H04W 88/08* (2009.01)

(52) U.S. Cl.
CPC .......... *H04M 1/0254* (2013.01); *H04W 88/08* (2013.01)

(58) Field of Classification Search
CPC .... H04M 1/0254; H04W 88/08; Y02D 10/00; G06F 1/20; G06F 1/206; G06F 1/3203;
(Continued)

(56) References Cited

U.S. PATENT DOCUMENTS

2006/0132302 A1* 6/2006 Stilp .................... G08B 25/009
340/10.5
2007/0099592 A1* 5/2007 Thome ................. H04B 1/3877
455/348

(Continued)

OTHER PUBLICATIONS

International Search Report and the Written Opinion from the International Searching Authority in related International Application NO. PCT/US2021/015172 dated May 31, 2021, 17 pages.

(Continued)

*Primary Examiner* — Md K Talukder
(74) *Attorney, Agent, or Firm* — The Marbury Law Group, PLLC

(57) ABSTRACT

A modular wireless communications system (edge device, etc.) that includes a base unit having a base unit processor and one or more additional units that each include a processor, in which the base unit processor is configured with processor-executable software instructions to determine whether the base unit has been combined with the one or more additional units to create a combined unit and/or whether one or more of the additional units have been detached from the combined unit. The processor may automatically perform an edge reconfiguration interrogation and enumeration (ERIE) operation in response to determining that the base unit has been combined with the one or more additional units to create the combined unit or in response to determining that one or more of the additional units have been detached from the combined unit.

20 Claims, 23 Drawing Sheets

Related U.S. Application Data

(60) Provisional application No. 62/968,800, filed on Jan. 31, 2020.

(58) Field of Classification Search
CPC .... G06F 15/177; G06F 9/5094; G06F 15/161; G06F 2200/1635; G06F 1/3287; H05K 7/023
See application file for complete search history.

(56) References Cited

U.S. PATENT DOCUMENTS

| | | | | |
|---|---|---|---|---|
| 2014/0019392 A1* | 1/2014 | Buibas | ................... | G06N 3/008 706/23 |
| 2014/0089232 A1* | 3/2014 | Buibas | ..................... | G06N 3/08 706/11 |
| 2016/0191682 A1* | 6/2016 | Filser | ................. | H04M 1/0274 455/557 |
| 2019/0280421 A1* | 9/2019 | Haba | ........................ | G06N 3/08 |
| 2019/0280428 A1* | 9/2019 | Haba | ................. | H01R 13/6205 |
| 2019/0377361 A1* | 12/2019 | Kim | ................... | G01C 21/3697 |

OTHER PUBLICATIONS

International Preliminary Report on Patentability (Chapter 1 of the Patent Cooperation Treaty) received in related Application No. PCT/US2021/015172 dated Aug. 11, 2022.

* cited by examiner

MODULE IDENTIFICATION METHOD FOR EXPANDABLE GATEWAY APPLICATIONS

CROSS REFERENCE TO RELATED APPLICATION

This application is a continuation application of U.S. application Ser. No. 17/158,266, filed on Jan. 26, 2021, which claims the benefit of priority to U.S. Provisional Application No. 62/968,800, entitled "Module Identification Method for Expandable Gateway Applications" filed Jan. 31, 2020, the entire contents of both of which are hereby incorporated by reference for all purposes.

BACKGROUND

Wireless communication technologies have been growing in popularity and use over the past several years. This growth has been fueled by better communications hardware, larger networks, and more reliable protocols. Wireless and Internet service providers are now able to offer their customers with an ever-expanding array of features and services, such as robust cloud-based services.

To better support these enhancements, more powerful consumer facing edge devices (e.g., consumer grade access points, IoT gateways, routers, switches, etc.) are beginning to emerge. These devices include more powerful processors, system-on-chips (SoCs), memories, antennas, power amplifiers, and other resources (e.g., power rails, etc.) that better support high-speed wireless communications and execute complex and power intensive applications facilitating edge computing.

In addition to high performance and functionality, consumers increasingly demand that their devices be affordable, future-proof (e.g., upgradeable, highly versatile, etc.) and small enough to be readily placed throughout a home or small office.

SUMMARY

A modular wireless communications system that includes a base unit having a base unit processor and one or more additional units that each include a processor, in which the base unit processor is configured with processor-executable software instructions to determine whether the base unit has been combined with the one or more additional units to create a combined unit, determine whether one or more of the additional units have been detached from the combined unit, and perform an edge reconfiguration interrogation and enumeration (ERIE) operation in response to determining that the base unit has been combined with the one or more additional units to create the combined unit or in response to determining that one or more of the additional units have been detached from the combined unit.

In some aspects, in response to determining that the base unit has been combined with the one or more additional units to create the combined unit, or in response to determining that one or more of the additional units have been detached from the combined unit, the base unit processor identifies all of the additional units within the combined unit, verifies the compatibility of all the identified additional units with one another, determines a purpose for each of the identified additional units, determines one or more functional capabilities for each of the identified additional units, and identifies redundancies in the combined unit based on the determined purposes and determined functional capabilities of the identified additional units.

In some aspects, the base unit processor is further configured to eliminate identified redundancies in the combined unit. In some aspects, in response to determining that the base unit has been combined with the one or more additional units to create the combined unit, or in response to determining that one or more of the additional units have been detached from the combined unit, the base unit processor determines a physical stacking order in which the additional units within the combined unit are combined, determines alternative stacking orders available with the additional units within the combined unit, compares an efficiency of the physical stacking order to an efficiency of each alternative stacking order, and sets a logical stacking order based on a result of the comparison of the efficiency of the physical stacking order and efficiencies of each alternative stacking order.

In some aspects, in response to determining that the base unit has been combined with the one or more additional units to create the combined unit, or in response to determining that one or more of the additional units have been detached from the combined unit, the base unit processor determines whether the maximum number of units has been exceeded, determines power requirements for each unit in the combined unit, determines an overall power budget for the combined unit, determines whether the power requirements of the units exceed the overall power budget of the combined unit, and performs a responsive action in response to determine that the power requirements of the units exceed the overall power budget of the combined unit.

In some aspects, the base unit processor may be configured to perform the responsive action in response to determine that the power requirements of the units exceed the overall power budget of the combined unit by enabling, disabling, powering up, powering down or throttling one or more of the additional units in the combined unit. In some aspects, the base unit processor automatically determines the resources, buses, network on chips (NoCs), and communication protocols for communicating information between the base unit and each additional unit in the combined unit in response to determining that the base unit has been combined with the one or more additional units to create the combined unit, or in response to determining that one or more of the additional units have been detached from the combined unit. In some aspects, the base unit processor automatically determines an addressing scheme or address structure for the communications between the base unit and each additional unit in the combined unit in response to determining that the base unit has been combined with the one or more additional units to create the combined unit, or in response to determining that one or more of the additional units have been detached from the combined unit. In some aspects, the base unit processor shares resources in a distributed fashion based on functional capabilities of each unit within the combined unit.

In some aspects, sharing the resources in the distributed fashion includes performing CPU sharing operations, performing memory sharing operations, performing distributed processing operations, performing communication system slicing operations, or performing application process distribution operations. In some aspects, in response to determining that the base unit has been combined with the one or more additional units to create the combined unit, or in response to determining that one or more of the additional units have been detached from the combined unit, the base unit processor performs operations that include sequentially traversing units in the combined unit to identify each unit in the combined unit, determining the order in which the units are stacked in the combined unit, determining the relative positions of each additional unit with respect to the base unit, and determining the resources, buses, network on chips (NoCs), and communication protocols that are used to communicate information between the unit in the combined unit based on the determined order or relative positions of the units. In some aspects, determining the resources, buses, NoCs, and communication protocols that are used to communicate information between the unit in the combined unit based on the determined order or relative positions of the units includes assigning higher speed modules (e.g., PCIe, etc.) to be used by units that are closer to the base unit, and assigning lower speed modules (e.g., SGMII, etc.) to those that are further from the base unit.

In some aspects, determining the resources, buses, network NoCs, and communication protocols that are used to communicate information between the unit in the combined unit based on the determined order or relative positions of the units includes assigning available PCIe modules to be used by units that are closer to the base unit, and assigning a serial gigabit media-independent interface (SGMII) to units further from the base unit after assigning all the available PCIe modules. In some aspects, in response to determining that the base unit has been combined with the one or more additional units to create the combined unit, or in response to determining that one or more of the additional units have been detached from the combined unit, the base unit processor performs operations that include dynamically switching one or more busses in the combined unit so that two or more additional unit may use the same addresses or the same range of addresses to communicate information.

In some aspects, in response to determining that the base unit has been combined with the one or more additional units to create the combined unit, or in response to determining that one or more of the additional units have been detached from the combined unit, the base unit processor performs operations that include sequentially traversing each unit in the combined unit, reading an electrically erasable programmable read-only memory (EEPROM) on a first traversed unit to determine its module type, setting the general-purpose input/output (GPIO) its respective address based on a position of the first traversed unit in the combined unit so its addresses is function of that unit's position within the stack, using the addresses to establish a link form the first traversed unit to the next unit in the combined unit, disconnecting a portion of the GPIO, and repeating the operations above to set the GPIOs or addresses for each subsequently traversed unit until addresses and communication links are established between all units in the combined unit.

In some aspects, in response to determining that the base unit has been combined with the one or more additional units to create the combined unit, or in response to determining that one or more of the additional units have been detached from the combined unit, the base unit processor performs operations that include determining or setting a power budget for each unit in the combined unit based on the available power resources, an estimate of the leakage power levels, a relative importance or influence of workloads and components in the unit, a thermal power envelope, or information included in a look up table.

In some aspects, in response to determining that the base unit has been combined with the one or more additional units to create the combined unit, or in response to determining that one or more of the additional units have been detached from the combined unit, the base unit processor performs operations that include balancing tradeoffs between performance and power consumption on the combined unit so as to ensure that each unit in the combined unit accomplish its intended functionality without the combined unit exceeding its power budget. In some aspects, in response to determining that the base unit has been combined with the one or more additional units to create the combined unit, or in response to determining that one or more of the additional units have been detached from the combined unit, the base unit processor performs operations that include preventing the combined unit form exceeding its power budget by selectively enabling units in the combined unit based on their positions with respect to the base unit, the relative importance of their functional capabilities to the operation of the combined unit, and its purpose for inclusion in the combined unit.

BRIEF DESCRIPTION OF THE DRAWINGS

The accompanying drawings, which are incorporated herein and constitute part of this specification, illustrate exemplary aspects of the claims, and together with the general description given above and the detailed description given below, serve to explain the features of the claims.

DETAILED DESCRIPTION

Figure 1A:
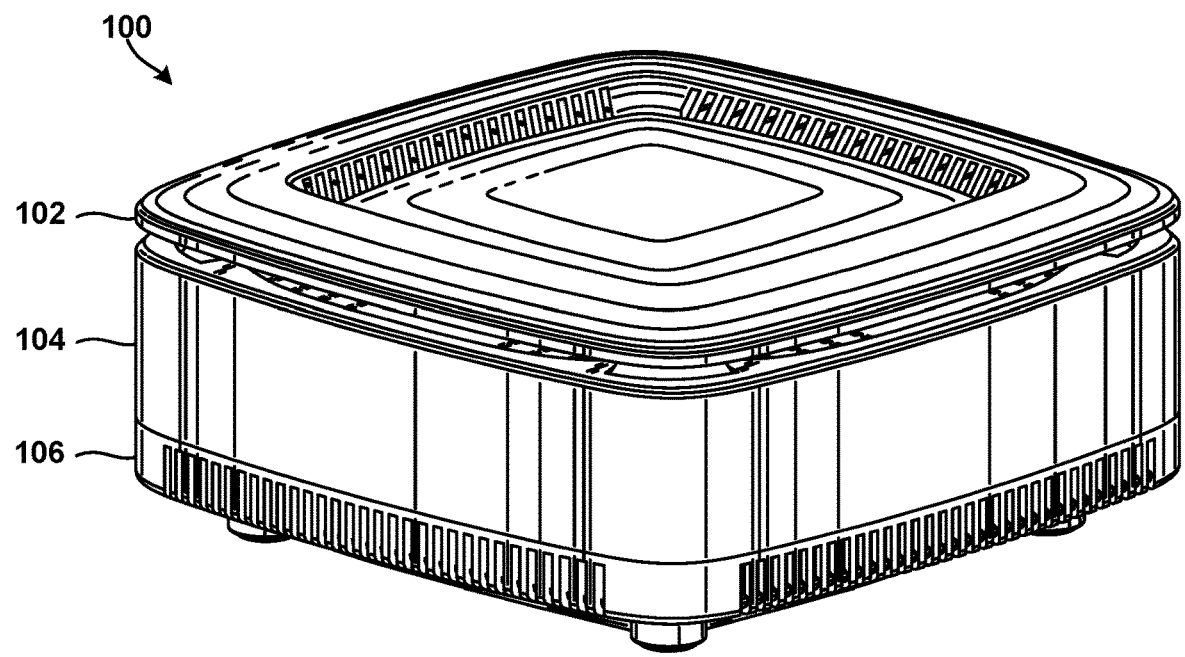
FIGS. 1A and 1B are top and bottom multidimensional views of a modular wireless communications system that includes a base unit that could be configured in accordance with some embodiments.

Various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various different bus and interconnect systems, standards or technologies may be included in or used by computing systems configured in accordance with the various embodiments, including any or all of the peripheral component interconnect (PCI), peripheral component interconnect express (PCIe), gigabit media-independent Interface (GMII), media-independent interface (MII), reduced media-independent interface (RMII), reduced gigabit media-independent interface (RGMII), serial gigabit media-independent interface (SGMII), high serial gigabit media-independent interface (HSGMII), quad serial gigabit media-independent interface (QSGMII), 10 gigabit media-independent interface (XGMII), System Management Bus (SMBus), and Inter-Integrated Circuit (I2C). Any references to terminology and/or technical details related to an individual bus or interconnection standard or technology are for illustrative purposes only, and not intended to limit the scope of the claims to a particular system or technology unless specifically recited in the claim language.

The various embodiments may include, use, incorporate, implement, provide access to a variety of wired and wireless communication networks, technologies and standards that are currently available or contemplated in the future, including any or all of Bluetooth®, Bluetooth Low Energy, Zig-Bee, LoRa, Wireless HART, Weightless P, DASH7, RPMA, RFID, NFC, LwM2M, Adaptive Network Topology (ANT), Worldwide Interoperability for Microwave Access (WiMAX), WIFI, WiFi6, WIFI Protected Access I & II (WPA, WPA2), personal area networks (PAN), local area networks (LAN), metropolitan area networks (MAN), wide area networks (WAN), networks that implement the data over cable service interface specification (DOCSIS), networks that utilize asymmetric digital subscriber line (ADSL) technologies, third generation partnership project (3GPP), long term evolution (LTE) systems, LTE-Direct, third generation wireless mobile communication technology (3G), fourth generation wireless mobile communication technology (4G), fifth generation wireless mobile communication technology (5G), global system for mobile communications (GSM), universal mobile telecommunications system (UMTS), high-speed downlink packet access (HSDPA), 3GSM, general packet radio service (GPRS), code division multiple access (CDMA) systems (e.g., cdmaOne, CDMA2000™), enhanced data rates for GSM evolution (EDGE), advanced mobile phone system (AMPS), digital AMPS (IS-136/TDMA), evolution-data optimized (EV-DO), digital enhanced cordless telecommunications (DECT), etc. Each of these wired and wireless technologies involves, for example, the transmission and reception of data, signaling and/or content messages.

Any references to terminology and/or technical details related to an individual wired or wireless communications standard or technology are for illustrative purposes only, and not intended to limit the scope of the claims to a particular communication system or technology unless specifically recited in the claim language.

The term "computing device" may be used herein to refer to any one or all of quantum computing devices, edge devices, Internet access gateways, modems, routers, network switches, residential gateways, access points, integrated access devices (IAD), mobile convergence products, networking adapters, multiplexers, personal computers, laptop computers, tablet computers, user equipment (UE), smailphones, personal or mobile multi-media players, personal data assistants (PDAs), palm-top computers, wireless electronic mail receivers, multimedia Internet enabled cellular telephones, gaming systems (e.g., PlayStation™, Xbox™, Nintendo Switch™, etc.), wearable devices (e.g., smartwatch, head-mounted display, fitness tracker, etc.), IoT devices (e.g., smart televisions, smart speakers, smart locks, lighting systems, smart switches, smart plugs, smart doorbells, smart doorbell cameras, smart air pollution/quality monitors, smart smoke alarms, security systems, smart thermostats, etc.), media players (e.g., DVD players, ROKU™, AppleTV™, etc.), digital video recorders (DVRs), and other similar devices that include a programmable processor and communications circuitry for providing the functionality described herein.

The term "quantum computing device" may be used herein to refer to a computing device or edge device, whether it is a standalone device or used in conjunction with current computing processes, that generates or manipulates quantum bits (qubits) or which utilizes quantum memory states. A quantum computing device may enhance edge computing capability by providing solutions that would be challenging to implement via conventional computing systems. This is especially true with value added computing for leveraging a diverse amount of sensors and other input data to arrive at a solution in real time. Through unifying diverse data sources a quantum computing solution at the edge may accelerate machine learning, solve complex problems faster as well as provide the fundamental platform for artificial intelligence nodes at the edge of the network. With the vast array of data delivered by sensors as well state information the quantum computing process may improve the memory allocation though the use of superposition allowing for more information to be simultaneously stored and processed.

The term "edge device" may be used herein to refer to a computing device that includes a programmable processor and communications circuitry for establishing communication links to consumer devices (e.g., smartphones, UEs, IoT devices, etc.) and/or to network components in a service provider, core, cloud, or enterprise network. For example, an edge device may include or implement functionality associated any one or all of an access point, gateway, modem, router, network switch, residential gateway, mobile convergence product, networking adapter, customer premise device, multiplexer and/or other similar devices.

The term "system on chip" (SOC) may be used herein to refer to a single integrated circuit (IC) chip that contains multiple resources and/or processors integrated on a single substrate. A single SOC may contain circuitry for digital, analog, mixed-signal, and radio-frequency functions. A single SOC may also include any number of general purpose and/or specialized processors (digital signal processors, modem processors, video processors, etc.), memory blocks (e.g., ROM, RAM, Flash, etc.), and resources (e.g., timers, voltage regulators, oscillators, etc.). SOCs may also include software for controlling the integrated resources and processors, as well as for controlling peripheral devices.

The term "system in a package" (SIP) may be used herein to refer to a single module or package that contains multiple resources, computational units, cores and/or processors on two or more IC chips, substrates, or SOCs. For example, a SIP may include a single substrate on which multiple IC chips or semiconductor dies are stacked in a vertical configuration. Similarly, the SIP may include one or more multi-chip modules (MCMs) on which multiple ICs or semiconductor dies are packaged into a unifying substrate. A SIP may also include multiple independent SOCs coupled together via high speed communication circuitry and packaged in close proximity, such as on a single backplane, single motherboard or in a single wireless device. The proximity of the SOCs facilitates high speed communications and the sharing of memory and resources.

The term "multicore processor" may be used herein to refer to a single integrated circuit (IC) chip or chip package that contains two or more independent processing cores (e.g., CPU core, IP core, GPU core, etc.) configured to read and execute program instructions. A SOC may include multiple multicore processors, and each processor in an SOC may be referred to as a core. The term "multiprocessor" may be used herein to refer to a system or device that includes two or more processing units configured to read and execute program instructions.

Some embodiments may be configured to perform edge reconfiguration interrogation and enumeration (ERIE) operations, which may include an interrogation operation, an enumeration operation, or a reconfiguration operation.

The term "interrogation operation" is used herein to refer to a set, group or category of operations that allow a device (e.g., based unit, etc.) to detect, through the stack connection using a several bus protocols, the inclusion of additional modules/units that are attached through the stacking mechanism to the base unit. The base unit is able to detect the inclusion or removal of the additional modules either at bootup or dynamically, hot swap. The base unit is able to determine that a module(s) have been added or removed from the previous history configuration of the combined base unit with stackable modules.

The term "enumeration operation" is used herein to refer to a set, group or category of operations that provide the ability to identify the type(s) of modules that are connected to the base unit. An enumeration operation may also determine the order the modules are stacked relative to the base unit. The enumeration operations may also be used to identify or determine whether the modules are stacked in an order that is correct (or not correct).

The term "reconfiguration operation" is used herein to refer to a set, group or category of operations that enable the units/modules that are connected, stacked, to the base unit. A reconfiguration operation may involve adjusting the base unit's functionality to incorporate the additional or removal of stacked unit(s). A reconfiguration operation may also involve determining the power budget required for each stacked unit and delivering the power as needed from the base unit through the stacking connector along with dynamically adjusting the power level or instructing the stacked modules to reduce their power consumption.

The embodiments include a modular wireless communications system, such as an edge device (e.g., Wi-Fi access points, IoT gateways, etc.), that includes a baseline feature set and an expandable architecture that allows end users to add specific features or functionality (e.g., digital concierge, home assistant, etc.) to the device as needed. The modular wireless communications system and its components may be configured, shaped, formed or arranged so that the customer or user can quickly physically attach additional units (e.g., an auxiliary unit, another base unit, etc.) above, below, or to the sides of a base unit. Once attached, the combined unit (i.e., the base unit and the attached additional units) may operate as a single unified device.

The embodiments also include methods for configuring components (e.g., system buses, processors, resources, etc.) within the individual units (e.g., the base unit, the attached additional units, etc.) so that they may be combined to operate as a single unified device. For example, one or more processors in the base unit may be configured so that, when the units are combined (e.g., when first stacked, upon detecting the addition or removal of a component or unit to the combined unit, etc.), the processors automatically perform interrogation, enumeration (or dynamic counting scheme), and/or reconfiguration operations. The processors may identify all the components/units within the combined unit, verify their compatibility with one another, determine the purpose or functional capabilities of each unit, identify and eliminate redundant components/units in the system, determine whether the units are stacked or combined properly, determine whether the physical order in which the units are stacked or combined is efficient (e.g., the most efficient order, etc.), determine whether the maximum number of units has been exceeded, determine power requirements for each unit, determine an overall power budget and whether the power requirements of the combined units exceed the overall power budget, power up or down individual units, determine the resources, buses, NoCs, and communication protocols that should be used to communicate information between the various components/units in the combined unit, determine an addressing scheme or structure for the communications, and/or perform other similar operations.

As mentioned above, a combined unit may include a base unit and one or more attached additional units. Each of these units may include, implement or use a variety of different data and control busses, interconnects or standards, including any or all of a peripheral component interconnect (PCI), peripheral component interconnect express (PCIe), gigabit media-independent Interface (GMII), media-independent interface (MII), reduced media-independent interface (RMII), reduced gigabit media-independent interface (RGMII), serial gigabit media-independent interface (SGMII), high serial gigabit media-independent interface (HSGMII), quad serial gigabit media-independent interface (QSGMII), 10 gigabit media-independent interface (XGMII), System Management Bus (SMBus), and Inter-Integrated Circuit ($I^2C$). Each of these resources (e.g., PCIe, SGMII, $I^2C$, etc.) may include different properties or characteristics (e.g., different bandwidths, communication speeds, different addressing schemes, etc.). In addition, some of these resources only be used by one unit (or only a few units) in the combined stack.

In some embodiments, one or more processors in the base unit may be configured so that, when the units are combined or modified, the processors automatically traverse the stack or combined unit to identify each unit in the stack/combination. The processors may determine the order in which the units are stacked/combined and/or determine their relative positions in the stack/combination with respect to the base unit. The processors may determine the resources, buses, NoCs, and communication protocols that are used to communicate information between the various components/units in the combined unit based on the relative positions of the units within the stack or combined unit.

That is, to operate efficiently, the higher speed PCIe modules should be used by units that are close to the base unit (e.g., at the bottom of the stack or by an additional unit that is stacked immediately above or below the base unit, etc.). The other, lower speed, modules should be used closer to top of the stack (e.g., at the top of the stack or by an additional unit that is stacked atop other additional units attached to the base unit, etc.). By determining relative positions of the units within the stack or combined unit, the processors may assign higher speed modules (e.g., PCIe, etc.) to be used by units that are closer to the base unit and assign lower speed modules (e.g., SGMII, etc.) to those that are further from the base unit. The processors may also activate or deactivate components within each unit based on the unit's position with respect to the base unit.

Some resources, such as $I^2C$ interconnects on the control path, have a limited number of addresses or address ranges that could be used for communicating data or control information. In some embodiments, the combined unit may be configured to dynamically switch one or busses in the system so that two or more components may use the same addresses (or range of addresses) to communicate information.

For example, the processors may be configured to sequentially traverse each unit in the combined unit. The processors may read the EEPROM on the first traversed unit to determine its module type, set the GPIOs or their respective addresses (e.g., I²C addresses, etc.) based on the unit's position in stack or combined unit (i.e., so that the addresses are a function of the unit's position within the stack), use the addresses to establish a link to the next unit in the stack or combined unit, disconnect a portion of the GPIOs or bus (set it and forget it), and then set the GPIOs or addresses for the next traversed unit. The processor may perform these operations repeatedly until addresses and communication links are assigned/established between all the units in the combined unit.

Generally, the combined unit may be subject to an overall power budget, or a rate or an amount of power that may be consumed by the device over a period of time. In some embodiments, the processors may determine or set the power budget (e.g., in units proportional to Watts, etc.) for each individual unit and/or for the combined unit based on the available power resources, an estimate of the leakage power levels, relative importance or influence of workloads and components in the unit, thermal power envelopes, information included in a look up table, etc.

In some embodiments, the processors may be configured to send a warning to a user and/or select a larger power supply in response to determining that that power requirements of the components/units (e.g., power required for the components to operate or accomplish their intended functionality) exceed the overall power budget of the combined unit.

In some embodiments, one or more units in the combined unit may be operable to decrease energy consumption or thermal energy generation at the expense of performance or increase performance at the expense of increased energy consumption or thermal energy generation. For example, one or more processors in the based unit may throttle (e.g., reduce operating frequency or periodically pause an operation) or temporarily reduce power to some of the components within a unit, throttle the processing clock frequency of one or more processing components (e.g., CPU, GPU, etc.), reduce display brightness settings, and/or perform other similar operations to ensure that the combined unit does not exceed its power budget, to reduce power consumption, or to dissipate excess thermal energy.

In some embodiments, the processors may be configured to balance tradeoffs between performance and power consumption on the combined unit so as to ensure that each unit may accomplish its intended functionality without the combined unit exceeding its power budget. That is, while the throttling operations may reduce power consumption, they may also reduce the performance and/or responsiveness of the unit or the types of operations that may be performed by that unit. As such, the processors may be configured to selectively enable (or activate, deactivate, power-up, power-off, throttle, etc.) components/units or combinations of components/units so as to ensure that all enabled components/units may accomplish their intended functionality without the combined unit exceeding its power budget. The processors may also selectively enable the components or units based on their positions with respect to the base unit, the relative importance of their functional capabilities to the operation of the combined unit, their purpose for inclusion in the combined unit, etc. so as to ensure that the combined unit does not exceed its power budget and/or to balance tradeoffs between performance and power consumption on the device.

In some embodiments, the processors may be configured to perform CPU sharing, distributed processing, and/or application process distribution operations. That is, the processors may take advantage of concurrency/parallelism and/or the multiprocessor resources available in the combined unit to improve the efficiency and speed of the modular wireless communications system (e.g., reduce power consumption, achieve fast response times, high performance, and high user interface responsiveness, etc.). For example, an applications processor in the base unit may be configured to offload operations to a processor in an auxiliary unit, thereby enabling improvements in processing and/or power efficiencies. The operations of offloading operations to an auxiliary unit may include converting or translating portions of a software application into code that is suitable for execution on the auxiliary unit, executing different portions of that software application in different heterogeneous units or processors at the same time, and communicating the results of the execution back to the applications processor in the base unit. In some embodiments this may be accomplished by the base unit may analyzing a software application's object code, identifying the operations that are required to be performed during execution of the object code, partitioning the object code into object code segments based on identified operations, determining whether each object code segment may be offloaded and processed in the auxiliary unit, translating the offload-able object code segments into a format that is suitable for execution in the auxiliary unit, and causing the auxiliary unit to execute the translated object code segments in parallel with the non-translated object code segments that executed by the processor(s) in the base unit.

In some embodiments, the processors may be configured to perform memory sharing operations and/or provide access to a memory that is shared between units (e.g., the base unit and an auxiliary unit, etc.), between resources (e.g., a general-purpose applications processor and an auxiliary processor, etc.), or between processes (e.g., a first process (P1) on an applications processor and a second process (P2) on an auxiliary processor, etc.).

Figure 1B:
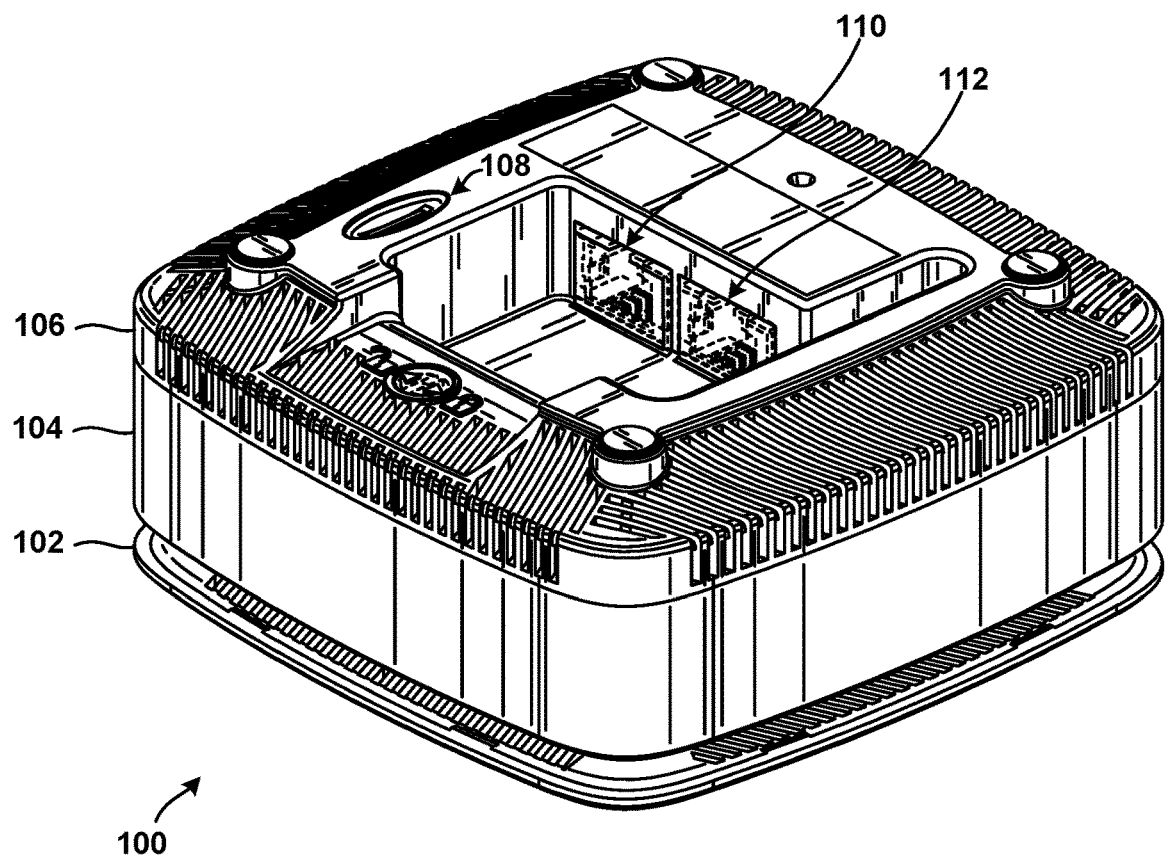

FIG. 1A is a multidimensional view from the top of a modular wireless communications system 100 that includes an LED/LID component 102, a stackable housing 104 for encapsulating its components (e.g., antenna, heatsink, processors, etc.), and a housing base 106. FIG. 1B is a multi-dimensional view from the bottom of the modular wireless communications system 100 that illustrates that the housing base 106 may various connector ports 108-112 that may be used to couple the components within the stackable housing 104 to other components.

Figure 2A:
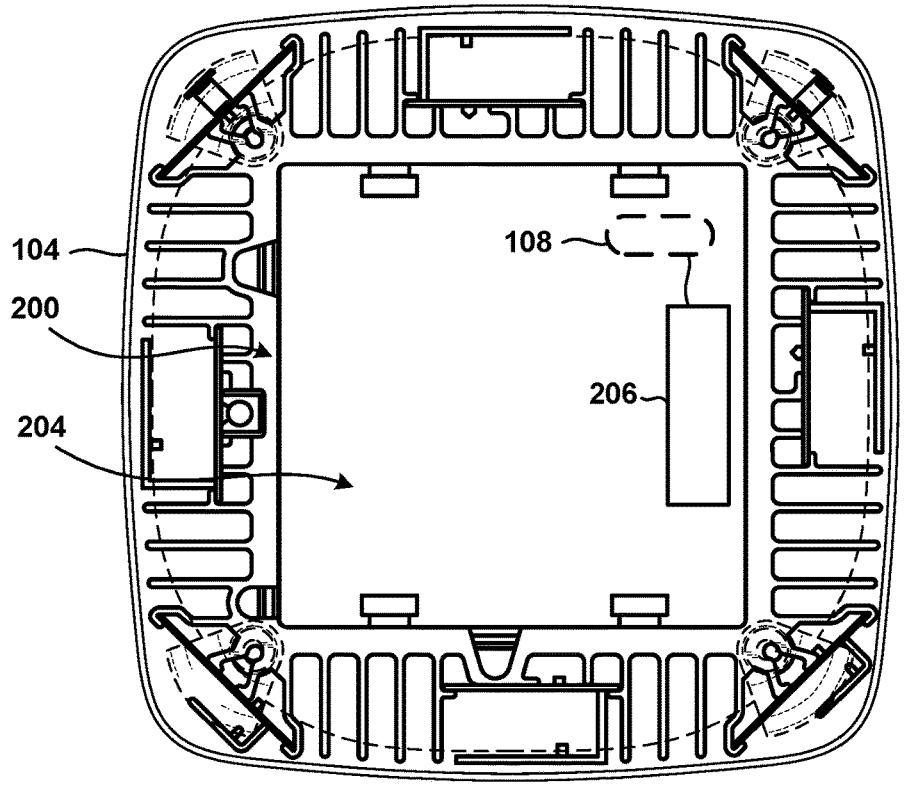
FIGS. 2A and 2B are top and bottom views of the modular wireless communications system illustrated in FIGS. 1A and 1B with the LED/LID component and/or housing base removed for stacking.
Figure 2B:
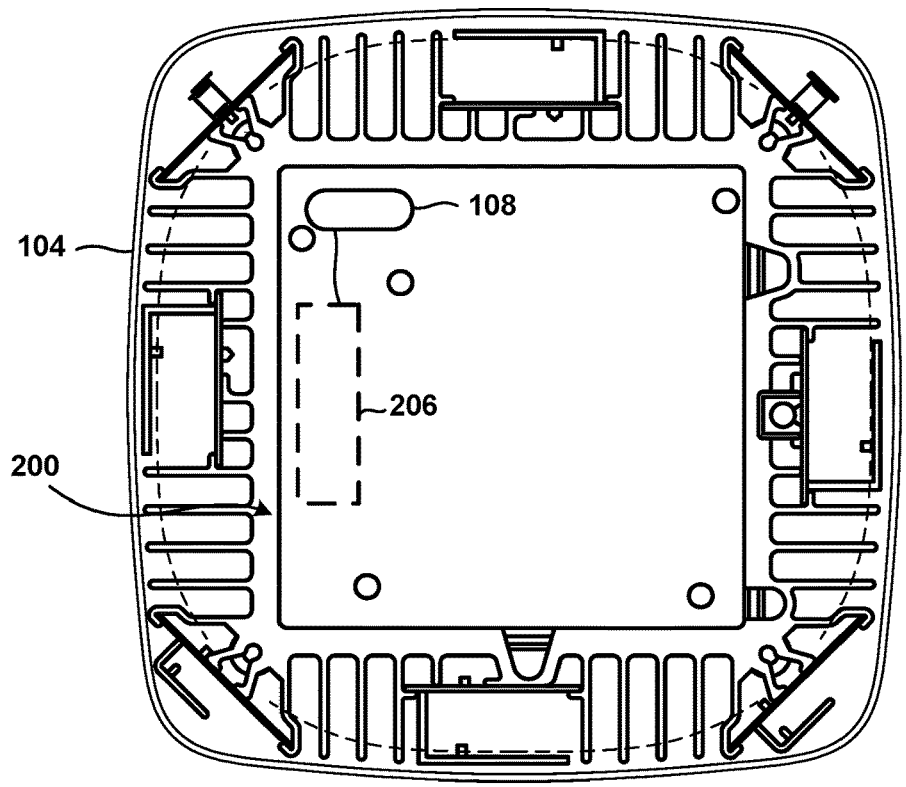

FIG. 2A is a top view of the modular wireless communications system 100 with the LED/LID component 102 removed, and FIG. 2B is a bottom view of the modular wireless communications system 100 with the housing base 106 removed. FIGS. 2A-B illustrate that the stackable housing 104 may encapsulate an integrated heatsink and antenna structure 200. The integrated heatsink and antenna structure 200 may include may include a cavity 204 onto which a processor, computing system, printed circuit board, integrated circuit (IC) chips, a system on chip (SOC), or system in a package (SIP) and/or other similar components may be implemented or placed. In some embodiments, the components/chips may be placed on a heat conducting material that is placed on top of the cavity 204 (or aluminum housing) to help with the heat transfer and to address any imperfections that arise during manufacturing. In some embodiments, additional components and/or circuitry may be located between the integrated heatsink and antenna structure 200 and the LED/LID component 102, stackable housing 104, and/or housing base 106.

The cavity 204 and/or the components (e.g., IC chips, SOC, SIP, etc.) may include connector ports 108, 206 that provide an interface between the SOC/SIP and other computers or peripheral devices. The connector ports 108, 206 may also allow other computers or peripheral devices to be physically attached above or below (or to the sides of) a base unit. That is, the stackable housing 104 and connector ports 108, 206 allow multiple components be stacked on top of, on the side of, or below another stackable housing 104, which then allows multiple integrated heatsink and antenna structures (e.g., 200) to be used together in a compact arrangement. Once attached, the combined unit (i.e., the base unit and the attached additional units) may operate as a single unified device.

Figure 3:
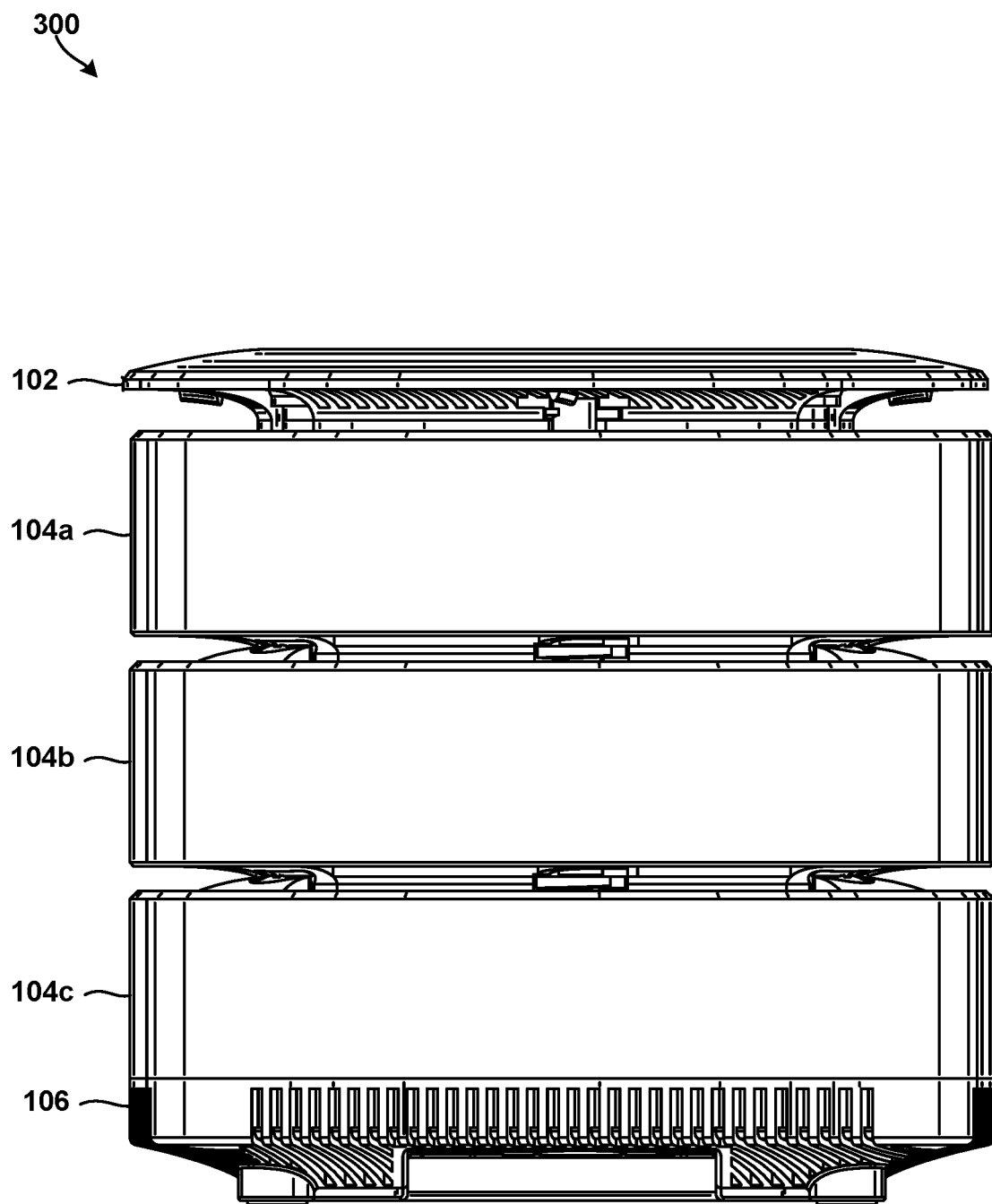
FIG. 3 illustrates a stacked or combined unit that may be configured to operate as a single unified modular wireless communications system in accordance with some embodiments.

FIG. 3 illustrates a combined unit 300 that may be configured to operate as a single unified modular wireless communications system in some embodiments. In the example illustrated in FIG. 3, the combined unit 300 includes an LED/LID component 102, a housing base 106, and three stackable housing 104a-104c that each encapsulate various components (e.g., antenna, heatsink, processors, etc.).

Figure 4A:
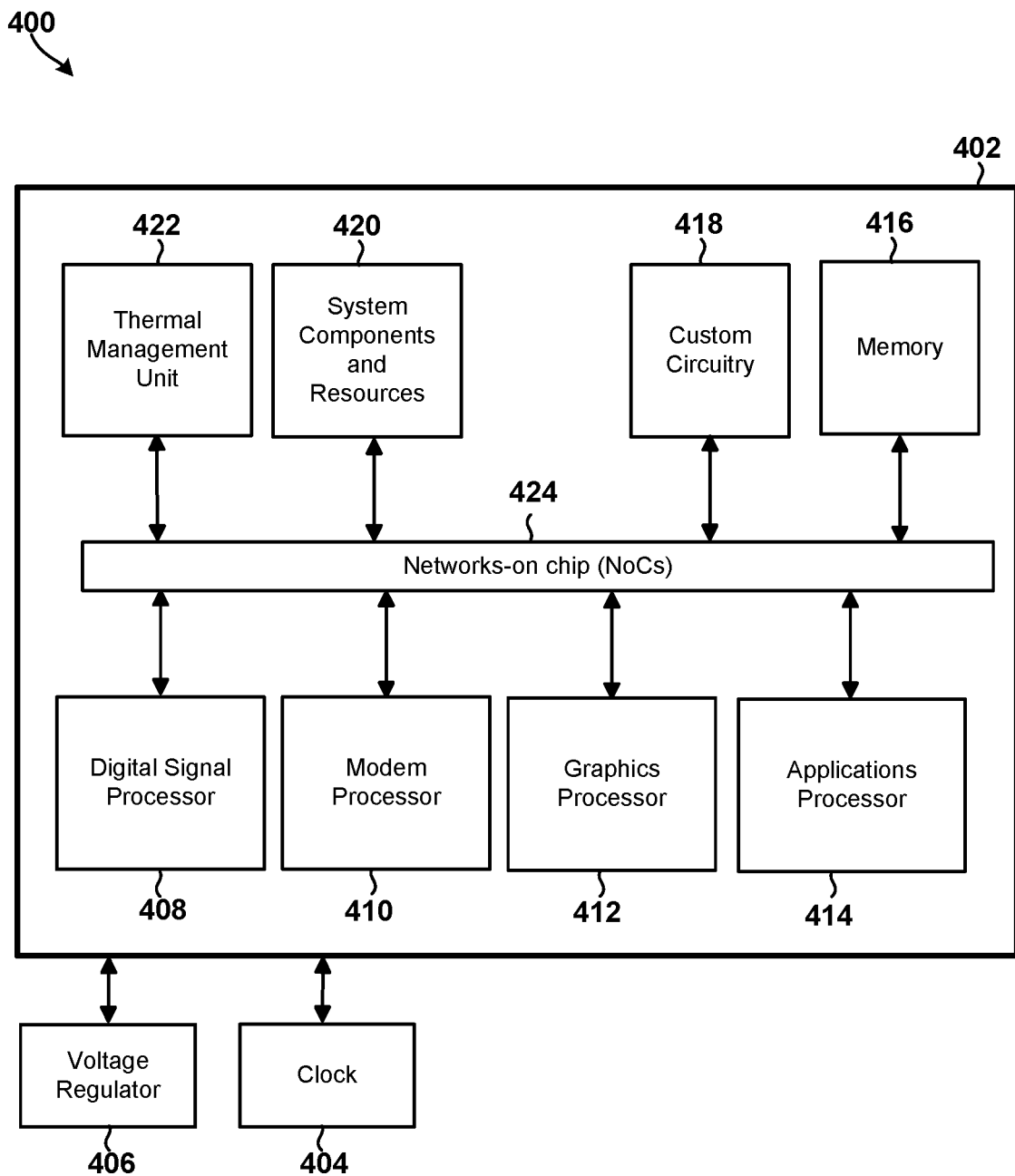
FIGS. 4A and 4B are component block diagrams illustrating a computing system that includes an expandable architecture and a stack connector that allows multiple units to be stacked or combined so that they operate as a single unified modular wireless communications system in accordance with some embodiments.
Figure 4B:
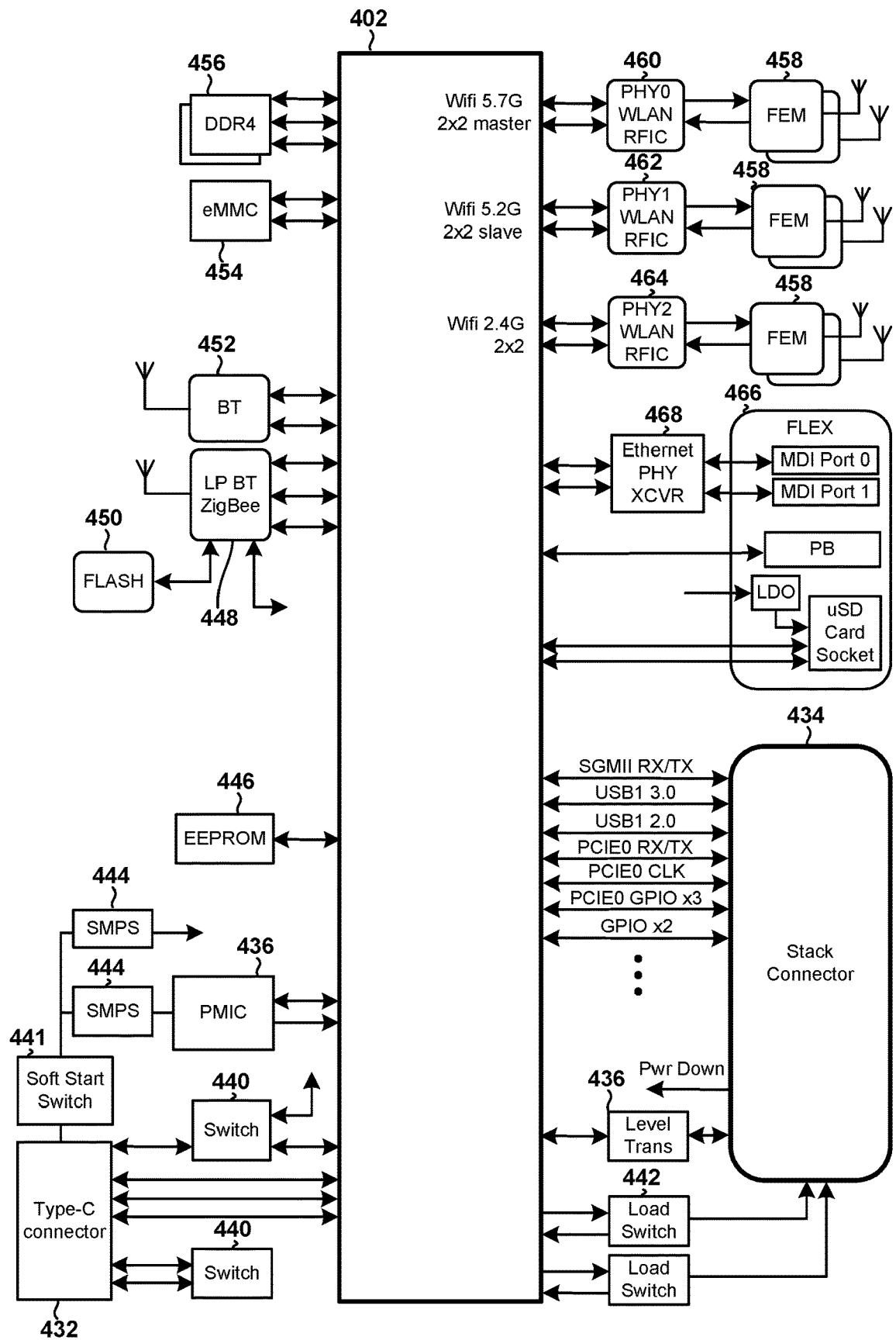

FIGS. 4A and 4B illustrates an example computing system 400 that may be included in each of the units 104a-104c in the combined stack 300 in accordance with some embodiments. In the example illustrated in FIG. 4A, the computing system 400 includes an SOC 402, a clock 404, and a voltage regulator 406. The SOC 402 may include a digital signal processor (DSP) 408, a modem processor 410, a graphics processor 412, an application processor 414 connected to one or more of the processors, memory 416, custom circuitry 418, system components and resources 420, a thermal management unit 422, and a networks on chip (NOCs) module 424. The SOC 402 may operate as central processing unit (CPU) that carries out the instructions of software application programs by performing the arithmetic, logical, control and input/output (I/O) operations specified by the instructions.

The thermal management unit 422 may be configured to monitor and manage the device's junction temperature, surface/skin temperatures and/or the ongoing consumption of power by the active components that generate thermal energy in the device. The thermal management unit 422 may determine whether to throttle the performance of active processing components (e.g., CPU, GPU, LCD brightness), the processors that should be throttled, the level to which the frequency of the processors should be throttled, when the throttling should occur, etc. The thermal management unit 422 may also determine the power budget and/or power requirements of the SOC 402.

The system components and resources 420 and custom circuitry 418 may manage sensor data, analog-to-digital conversions, wireless data transmissions, and perform other specialized operations, such as decoding data packets and processing video signals. For example, the system components and resources 420 may include power amplifiers, voltage regulators, oscillators, phase-locked loops, peripheral bridges, temperature sensors (e.g., thermally sensitive resistors, negative temperature coefficient (NTC) thermistors, resistance temperature detectors (RTDs), thermocouples, etc.), semiconductor-based sensors, data controllers, memory controllers, system controllers, access ports, timers, and other similar components used to support the processors and software clients running on a device. The custom circuitry 418 may also include circuitry to interface with other computing systems and peripheral devices, such as wireless communication devices, external memory chips, etc.

Each processor 408, 410, 412, 414 may include one or more cores, and each processor/core may perform operations independent of the other processors/cores. For example, the SOC 402 may include a processor that executes a first type of operating system (e.g., FreeBSD, LINUX, OS X, macOS, etc.) and a processor that executes a second type of operating system (e.g., ANDROID, IOS, MICROSOFT WINDOWS 10, MICROSOFT SERVER 1903, etc.). In addition, any or all of the processors 408, 410, 412, 414 may be included as part of a processor cluster architecture (e.g., a synchronous processor cluster architecture, an asynchronous or heterogeneous processor cluster architecture, etc.).

The processors 408, 410, 412, 414 may be interconnected to one another and to the memory 418, system components and resources 420, and custom circuitry 418, and the thermal management unit 422 via high-performance networks-on chip (NoCs) 424 or an interconnection/bus module. The NoCs 424 or interconnection/bus module may include an array of reconfigurable logic gates and/or implement a bus architecture (e.g., CoreConnect, AMBA, etc.).

The SOC 402 may further include an input/output module (not illustrated) for communicating with resources external to the SOC, such as the clock 404 and the voltage regulator 406. Resources external to the SOC (e.g., clock 604, etc.) may be shared by two or more of the internal SOC processors/cores.

In addition to the SOC 402 discussed above, the various embodiments may include or may be implemented in a wide variety of computing systems, which may include a single processor, multiple processors, multicore processors, or any combination thereof.

FIG. 4B illustrates that the computing system 400 may include a type-C connector 432 and a stack connector 434, each of which may correspond to and/or may be used in conjunction with the connector ports 108-112 and 206 illustrated in FIGS. 1A-2B.

The type-C connector 432 and/or stack connector 434 may include an interconnection/bus module with various data and control lines for communicating with the SOC 402. The type-C connector 432 and/or stack connector 434 may also expose systems buses and resources of a SOC 402 or computing device 400 in a manner that allows the chip or computing system to attach to an additional unit to include additional features, functions or capabilities, but which preserves the performance and integrity of the original SOC 402 or computing device 400. The type-C connector 432 and/or stack connector 434 may include proprietary or custom connector pin-outs that allow for stacking interfaces and/or for the device to be retrofitted after deployment to expand its capabilities. This allows the device to have a longer life cycle, and for the manufacturer to obtain additional revenues from accessory sales, keep the baseline cost of the product down, and sell in a cheaper market with the option to upsell later with additional add-on features.

The type-C connector 432 and/or stack connector 434 may include or control various system busses and data/control lines, such as serial gigabit media-independent interface (SGMII), universal serial bus (USB), peripheral component interconnect express (PCIe), general-purpose input/output (GPIO), etc. The stack connector 434 may also include links to a dual bidirectional inter-integrated circuit ($I^2C$) bus and SMBus voltage-level translator (e.g., Level Trans 436) and various load switches. Some of these resources may only be used by one unit 104a-104c in the combined stack 300 at a time, and each of these resources may include different properties or characteristics (e.g., different bandwidths, communication speeds, etc.).

In addition, the computing system 400 illustrated in FIG. 4B may include switches 440, a soft start switch 441, load switches 442, switched mode power supply (SMPS) 444, electrically erasable programmable read only memory and (EEPROM) 446, a low power bluetooth or zigbee chip 448, a Bluetooth unit 452, an embedded multimedia card (eMMC) 454, a double data rate 4 synchronous dynamic random-access memory (DDR4) 456, front end modules (FEMs) 458, PHY0 WLAN RFIC 460, PHY1 WLAN RFIC 462, PHY2 WLAN RFIC 464, a FLEX unit 466, and Ethernet PHY XCVR 468.

The switches 440 may be physical switch(s) that used to supply power to the device from an external power source. The soft start switch 441 may be software controlled switch configured to activate switching power supplies. The load switches 442 may configured to provide power to stacking modules or other peripheral using a common power bus (in this case 3 VDC and 12 VDC). The SMPS 444 may be switched mode power supply used to supply power to convert external power source to the required voltage levels needed for the device to operate correctly. The EEPROM 446 may store key system parameters. The low power bluetooth or zigbee chip 448 may be radio circuit that provides Zigbee and/or Low Power BT. The Bluetooth unit 452 may be a radio circuit configured to provide Bluetooth services.

The eMMC 454 may be configured to put multimedia card (MMC) components, flash memory plus controller, into a small ball grid array (BGA) to be an embedded non-volatile memory system. An eMMC chip may include a controller and the same NAND flash memory along with a controller that manages wear leveling and error correction (ECC). The DDR4 456 may be synchronous dynamic random-access memory (RAM) or the device. The FEMs 458 may include the radio frequency (RF) front end for the various radio services. A FEM 458 may include radio frequency filters, transmit power amplifier, Low Noise Amplifiers (LNA), a preamp, and other supporting RF components.

PHY0 WLAN RFIC 460 may be a physical wireless LAN radio frequency integrated circuit used for the delivering upper 5 GHz WiFi service (5.7 GHz band). PHY1 WLAN RFIC 462 may be the physical wireless LAN radio frequency integrated circuit used for the delivering lower 5 GHz WiFi service (5.2 GHz band). PHY2 WLAN RFIC 464 may be the physical wireless LAN radio frequency integrated circuit used for the delivering 2.4 GHz WiFi service.

The FLEX unit 466 may be flexible unit that is configured to provide connectivity from the main C25 unit to dual ethernet connectors, SD cards, etc. The FLEX unit 466 may also include or provide receiver power for the C25 unit through a Power over Ethernet (POE) through a lower stacking unit that facilitates desk, ceiling and wall mounts. Ethernet PHY XCVR 468 may be an Ethernet transceiver used for providing the electrical interface between 402 and ethernet port 0 and 1.

Figure 5:
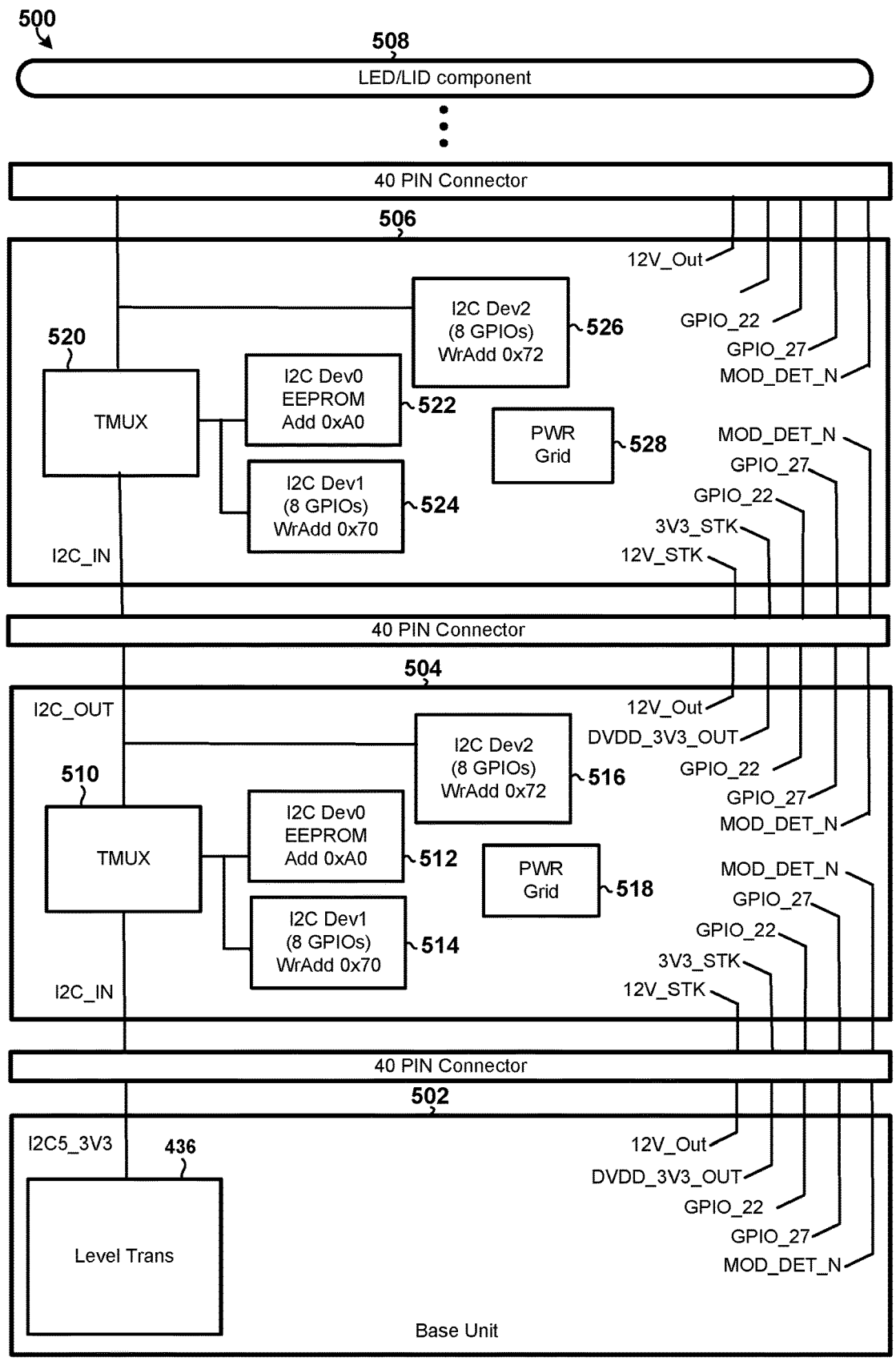
FIGS. 5 and 6 are component block diagrams illustrating example computing and bus architectures that could be used to configure the components in a stacked or combined unit to operate as a single unified modular wireless communications system in accordance with some embodiments.
Figure 6:
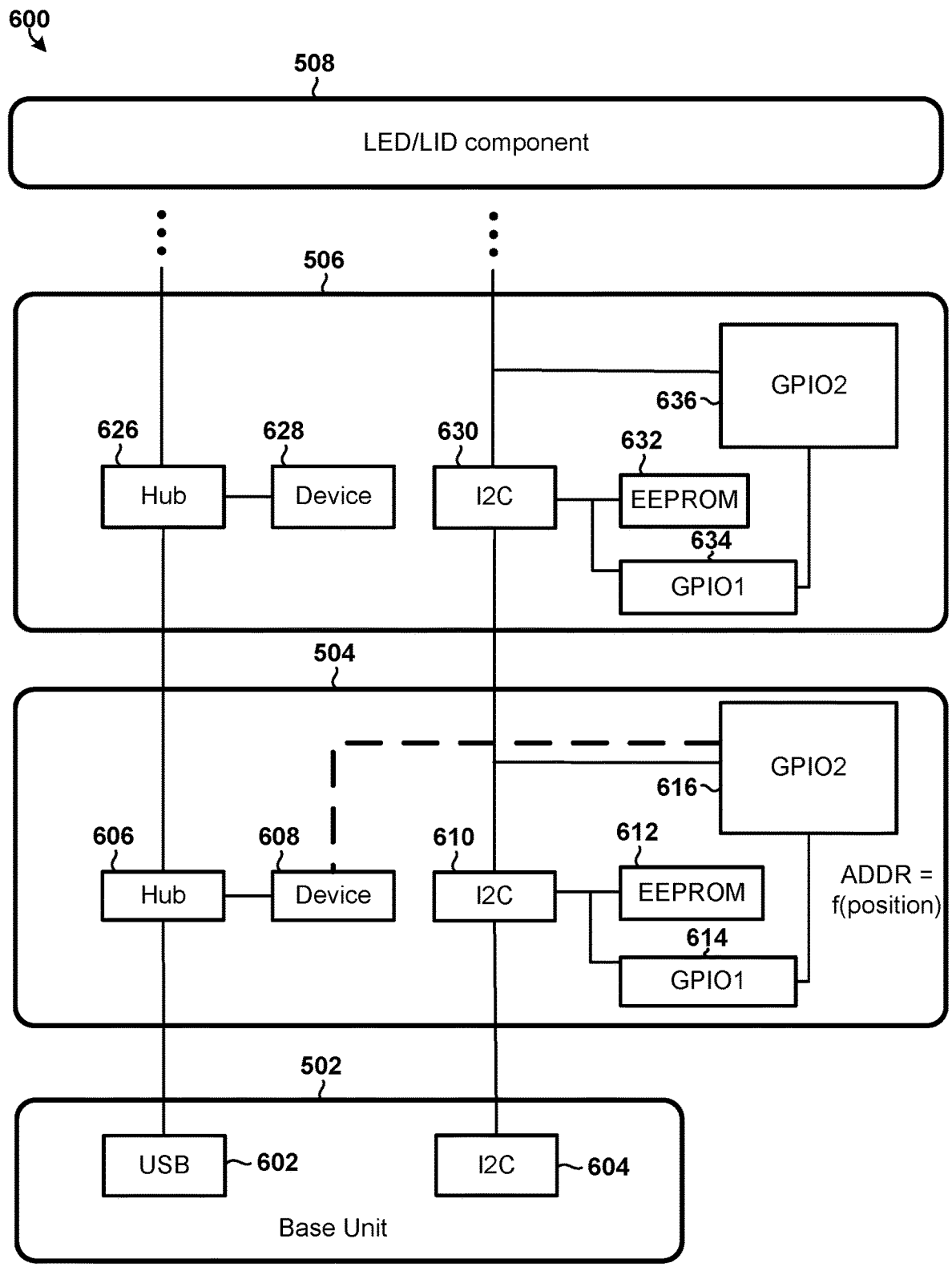

FIGS. 5 and 6 illustrate example computing and communication architectures 500, 600 that could be used to configure the components in a combined unit (e.g., combined unit 300 illustrated in FIG. 3) to operate as a single unified device in accordance with some embodiments. In some embodiments, configuring the components in the combined unit may include identifying and enumerating the components up and down the stack, verifying the compatibility of the components, and/or determining whether (or ensuring that) a proper stacking order is maintained, the maximum number of components/units is not exceeded, enough power budget is available, that there is no duplication of system functionality/modules, etc.

In the examples illustrated in FIGS. 5 and 6, the computing and communication architecture of a modular wireless communications system 500 that includes a base unit 502 and additional units 504, 506, 508. Each unit 502-508 is connected to a preceding and/or subsequent unit via a 40 pin connector (or connector ports 108, 206, etc.). In some embodiments, the modular wireless communications system 500 may be an edge device and/or configured to provide or perform edge computing operations/functions, which improve the user experience by offloading computation-intensive tasks to edge devices or servers deployed at the edge of the networks, thereby freeing up resources on the computing device and/or allowing the computing device to perform more computations or more resource-intensive tasks. In some embodiments, additional unit 508 may be an LED/LID component (e.g., LED/LID component 102 illustrated in FIGS. 1A-3) and units 502-506 may be included in stackable housings (e.g., stackable housings 104a-104c) illustrated in FIGS. 1A-3.

In the example illustrated in FIG. 5, the base unit 502 may include a SMBus voltage-level translator (e.g., Level Trans 436). Additional units 504, 506 include a TMUX 510, 520, an I2C Dev0 EEPROM Add 0xA0 512, 522, an I2C Dev1 (8 GPIOs) WrAdd 0x70 514, 524, I2C Dev2 (8 GPIOs) WrAdd 0x72 516, 526, and a power grid 518, 528. In the example illustrated in FIG. 6, the base unit 502 includes a USB port 602 and an Inter-Integrated Circuit (I2C) 604. Additional units 504, 506 include a hub 606, 626, device 608, 628, I2C 610, 630, EEPROM 612, 632, GPIO1 614, 634, and GPIO2 616, 636.

With reference to FIGS. 5 and 6, the base unit 502 may include a baseline feature set and an expandable architecture that allows end users to add specific features or functionality (e.g., digital concierge, home assistant, etc.) to the device as needed. In some embodiments, the base unit 502 and the one or more additional units 504-508 may operate independently and may be combined to operate as a single unified device 500. In some embodiments, the base unit 502 and/or the one or more additional units 504-508 may include a processor configured so that, when the units are combined (e.g., when first stacked, upon detecting the addition or removal of a component or unit to the combined unit, etc.), the processor(s) automatically performs an edge reconfiguration interrogation and enumeration (ERIE) operation.

The base unit 502 may be configured, shaped, formed or arranged so that the customer or user can quickly physically attach additional units above, below, or to the sides of a base unit. Once attached, the combined unit (i.e., the base unit and the attached additional units) may operate as a single unified device.

Each unit 502-508 may be each be configured so that they operate as a single unified device when combined. For example, one or more processors (e.g., processors 408-414 illustrated in FIG. 4, etc.) in the base unit 502 may be configured so that, when the units are combined (e.g., when first stacked, upon detecting the addition or removal of a component or unit to the combined unit, etc.), the processors automatically perform interrogation, enumeration (or dynamic counting scheme), and/or reconfiguration operations. The processors may identify all the components/units within the combined unit, verify the compatibility each unit 502-508 with one another, determine the purpose or functional capabilities of each unit 502-508, identify and eliminate redundant components/units 502-508 in the system, determine whether the units 502-508 are stacked or combined properly, determine whether the physical order in which the units 502-508 are stacked or combined is efficient (e.g., the most efficient order, etc.), determine whether the maximum number of units 502-508 has been exceeded, determine power requirements for each unit 502-508, determine an overall power budget and whether the power requirements of the combined units (e.g., units 502 through 508) exceed the overall power budget, power up or down individual units 502-508, determine the resources, buses, NoCs, and communication protocols that should be used to communicate information between the various components/units 502-508 in the combined unit, determine an addressing scheme or structure for the communications, and/or perform other similar operations.

Figure 7A:
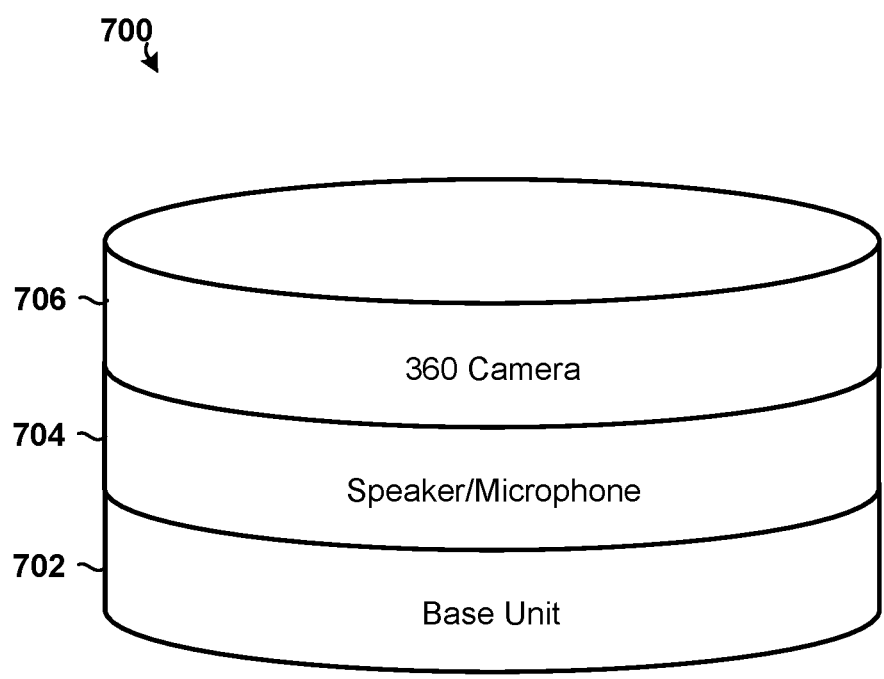
FIGS. 7A-7C are component block diagrams illustrating example units that could be included in a stacked or combined unit in various embodiments.
Figure 7B:
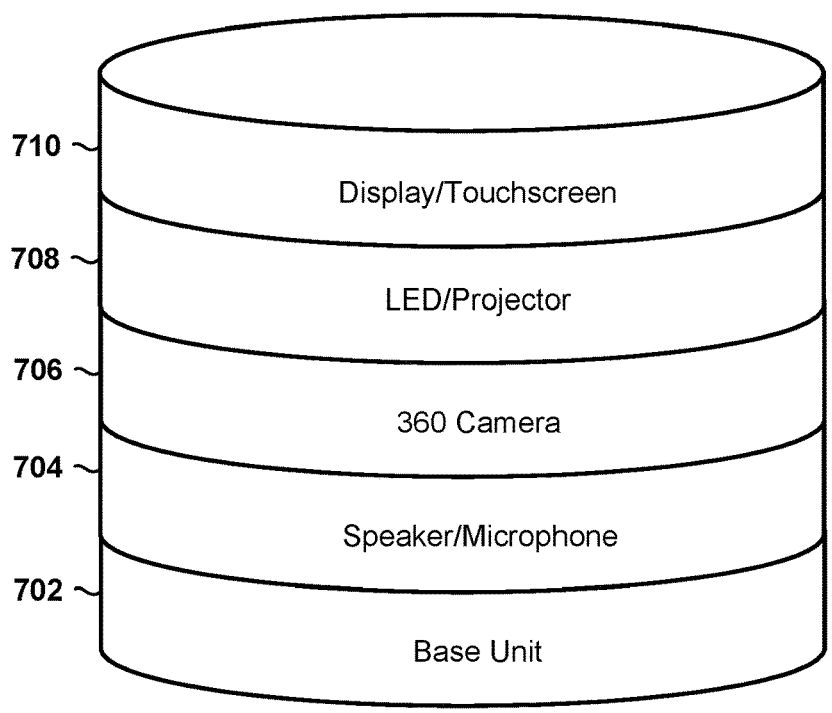
Figure 7C:
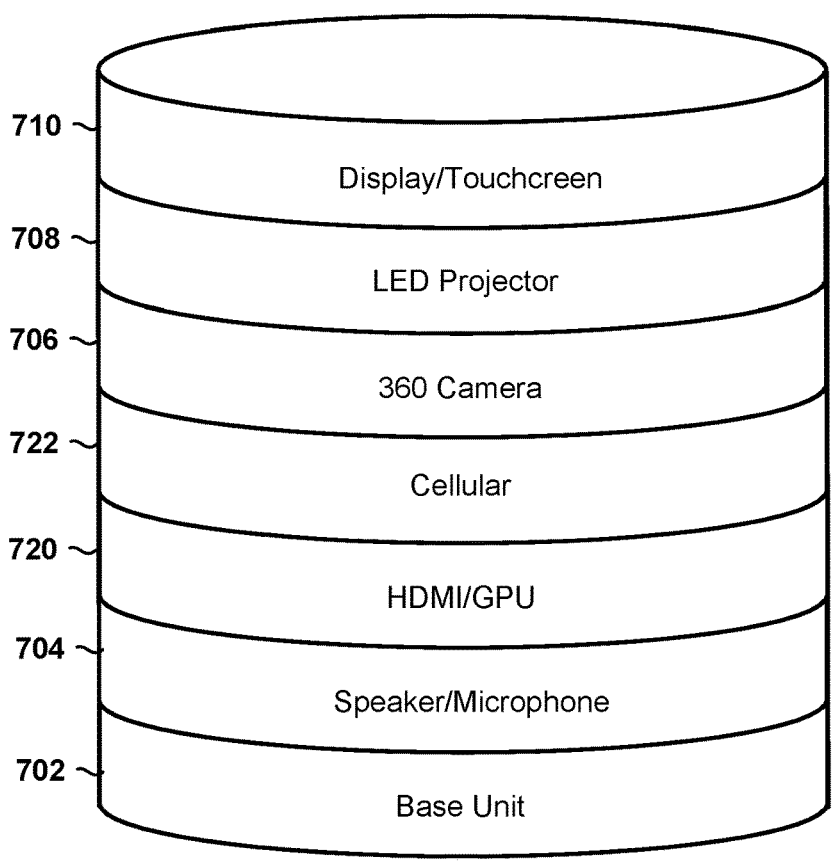

FIGS. 7A-7C illustrate example units that could be included in a stacked or combined unit in various embodiments. For example, FIG. 7A illustrates that a combined unit may include a base unit 702, a speaker/microphone auxiliary unit 704, and a 360-degree camera auxiliary unit 706.

FIG. 7B illustrates that a combined unit may be modified to include the base unit 702, the speaker/microphone auxiliary unit 704, the 360 degree camera auxiliary unit 706, a LED/Projector auxiliary unit 708, and a display/touchscreen auxiliary unit 710. FIG. 7C illustrates that the combined unit may be reorganized and further modified to include an HDMI/GPU unit 720 and a cellular unit 722. Each of the units (e.g., base unit and auxiliary units) may include any or all of the components described in this application (e.g., with reference to FIGS. 4A through 6, etc.).

Figure 8:
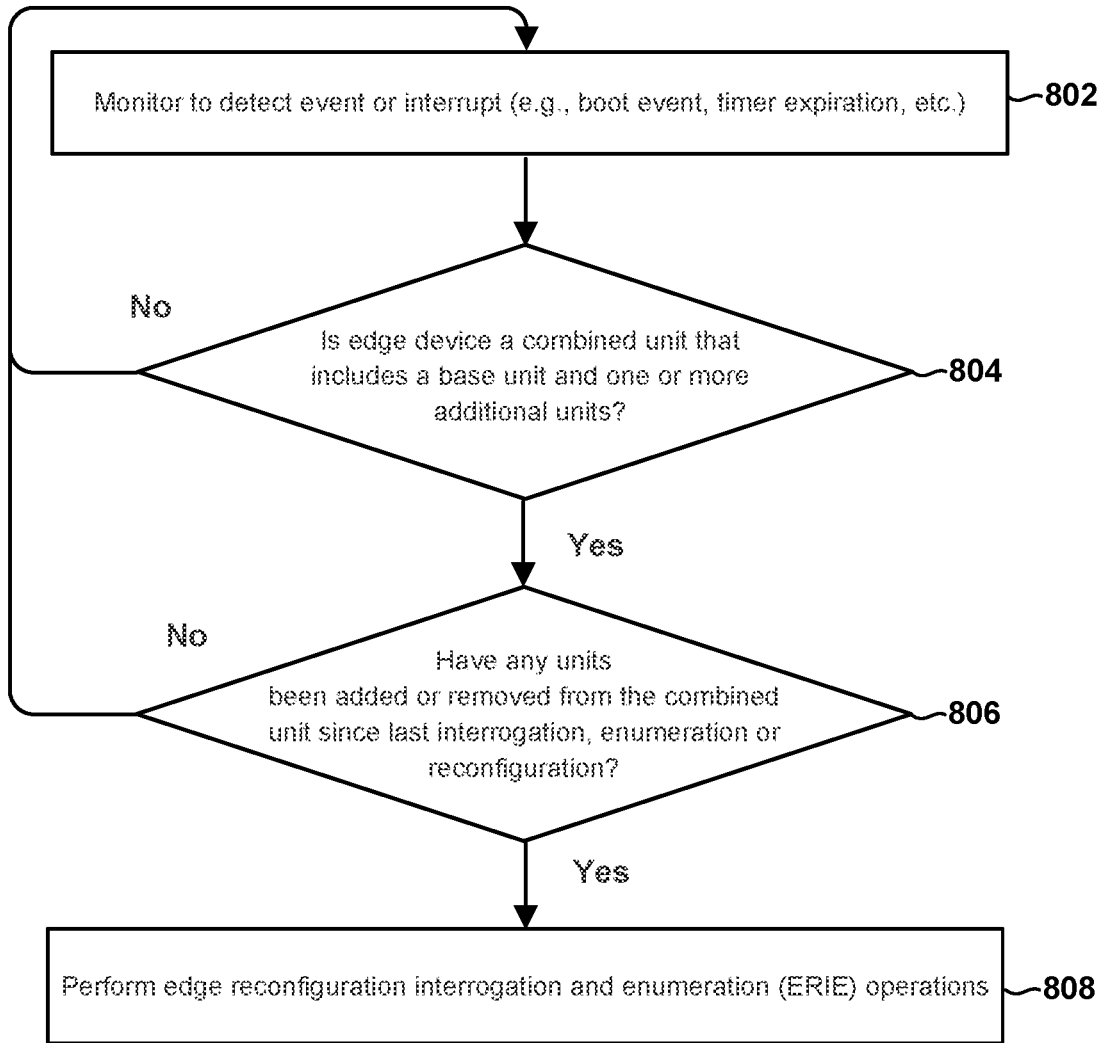
FIGS. 8-21 are process flow diagrams illustrating methods of operating an edge device with an expandable architecture in accordance with various embodiments.

FIG. 8 illustrates a method 800 for operating an edge device (or modular wireless communications system) with an expandable architecture in accordance with some embodiments. Method 800 may be performed by one or more processors (e.g., processors 408-414, etc.) in a base unit (e.g., base unit 502, 702, etc.) or one or more of the additional units (e.g., units 506-508, etc.) in a combined unit.

In block 802, the processor(s) may monitor sensors or conditions on the device to detect certain events or interrupts (e.g., boot event, timer expiration, etc.). In determination block 804, the processor(s) may determine whether the edge device is a combined unit that includes a base unit and one or more additional units. In response to determining that the edge device is a combined unit that includes a base unit and one or more additional units (i.e., determination block 804 ="Yes"), in determination block 806 the processor(s) may determine whether any units been added or removed from the combined unit since last time an interrogation, enumeration or reconfiguration operation was performed due to the device being adjusted, reconfigured or changed.

In response to determining that the edge device is a combined unit that includes a base unit and one or more additional units and/or that one or more units have been added or removed from the combined unit (i.e., determination blocks 804 and 806=="Yes"), in block 808 the processor(s) may perform edge reconfiguration interrogation and enumeration (ERIE) operations (e.g., at least one or more of an interrogation operation, an enumeration operation, or a reconfiguration operation).

Figure 9:
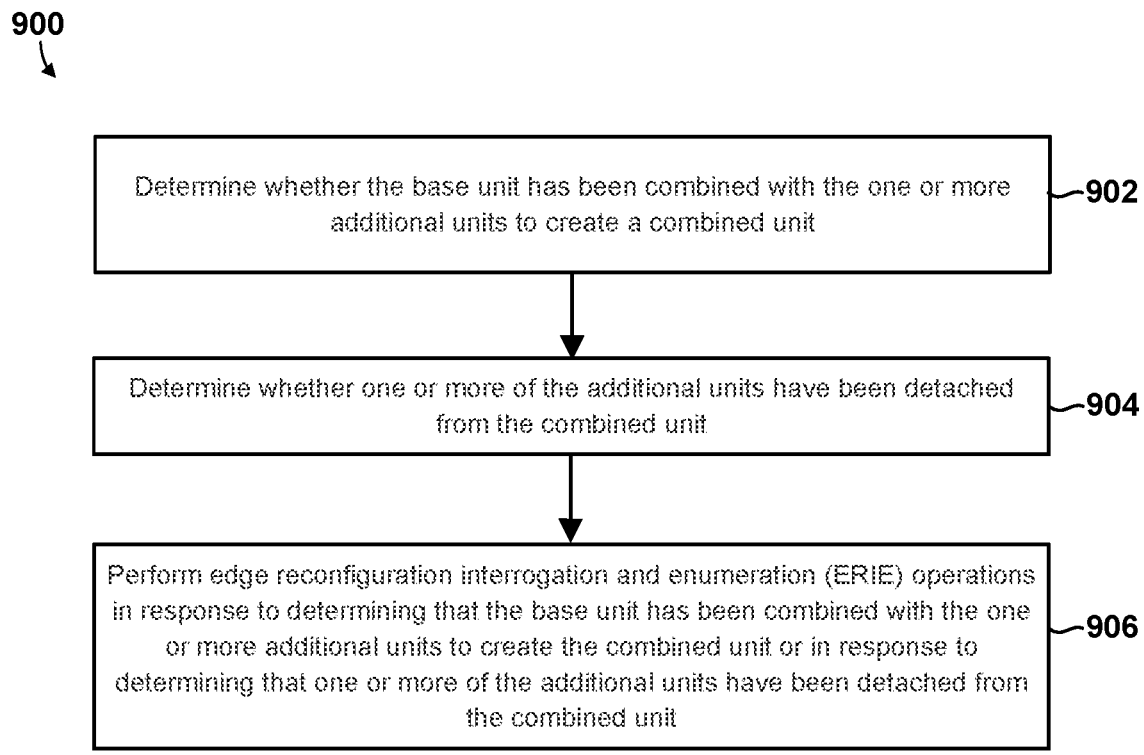

FIG. 9 illustrates a method 900 for operating an edge device (or modular wireless communications system) with an expandable architecture in accordance with some embodiments. Method 900 may be performed by one or more processors (e.g., processors 408-414, etc.) in a base unit (e.g., base unit 502, 702, etc.) or one or more of the additional units (e.g., units 506-508, etc.) in a combined unit.

In block 902, the processor(s) may determine whether the base unit has been combined with the one or more additional units to create a combined unit. In block 904, the processor(s) may determine whether one or more of the additional units have been detached from the combined unit. In block 906, the processor(s) may perform an ERIE operation in response to determining that the base unit has been combined with the one or more additional units to create the combined unit or in response to determining that one or more of the additional units have been detached from the combined unit.

Figure 10:
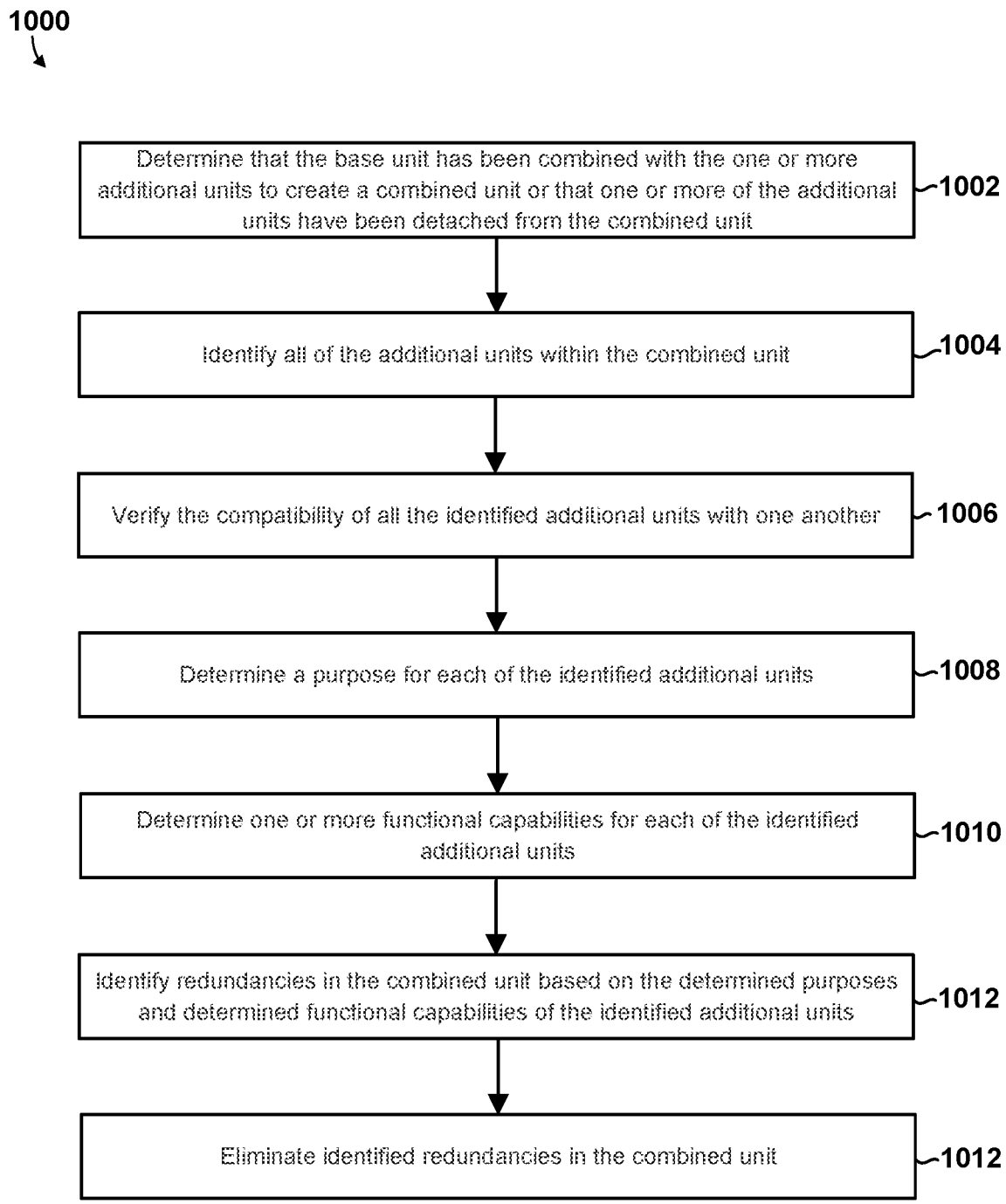

FIG. 10 illustrates a method 1000 for operating an edge device (or modular wireless communications system) with an expandable architecture in accordance with some embodiments. Method 1000 may be performed by one or more processors (e.g., processors 408-414, etc.) in a base unit (e.g., base unit 502, 702, etc.) or one or more of the additional units (e.g., units 506-508, etc.) in a combined unit.

With reference to FIG. 10, in block 1002 the processor(s) may determine that the base unit has been combined with the one or more additional units to create a combined unit (e.g., as part of block 902, etc.) or that one or more of the additional units have been detached from the combined unit (e.g., as part of block 904, etc.). In response, in block 1004, the processor(s) may identify all of the additional units within the combined unit. In block 1006, the processor(s) may verify the compatibility of all the identified additional units with one another. In block 1004, the processor(s) may determine a purpose for each of the identified additional units. In block 1004, the processor(s) may determine one or more functional capabilities for each of the identified additional units. In block 1004, the processor(s) may identify redundancies in the combined unit based on the determined purposes and determined functional capabilities of the identified additional units. In block 1004, the processor(s) may eliminate identified redundancies in the combined unit.

FIGS. 11-21 illustrate methods 1100-2100 for operating an edge device (or modular wireless communications system) with an expandable architecture in accordance with some embodiments. Methods 1100-2100 may be performed by one or more processors (e.g., processors 408-414, etc.) in a base unit (e.g., base unit 502, 702, etc.) or one or more of the additional units (e.g., units 506-508, etc.) in a combined unit. In each of methods 1100-2100, in block 1002 the processor(s) may determine that the base unit has been combined with the one or more additional units to create a combined unit or that one or more of the additional units have been detached from the combined unit.

Figure 11:
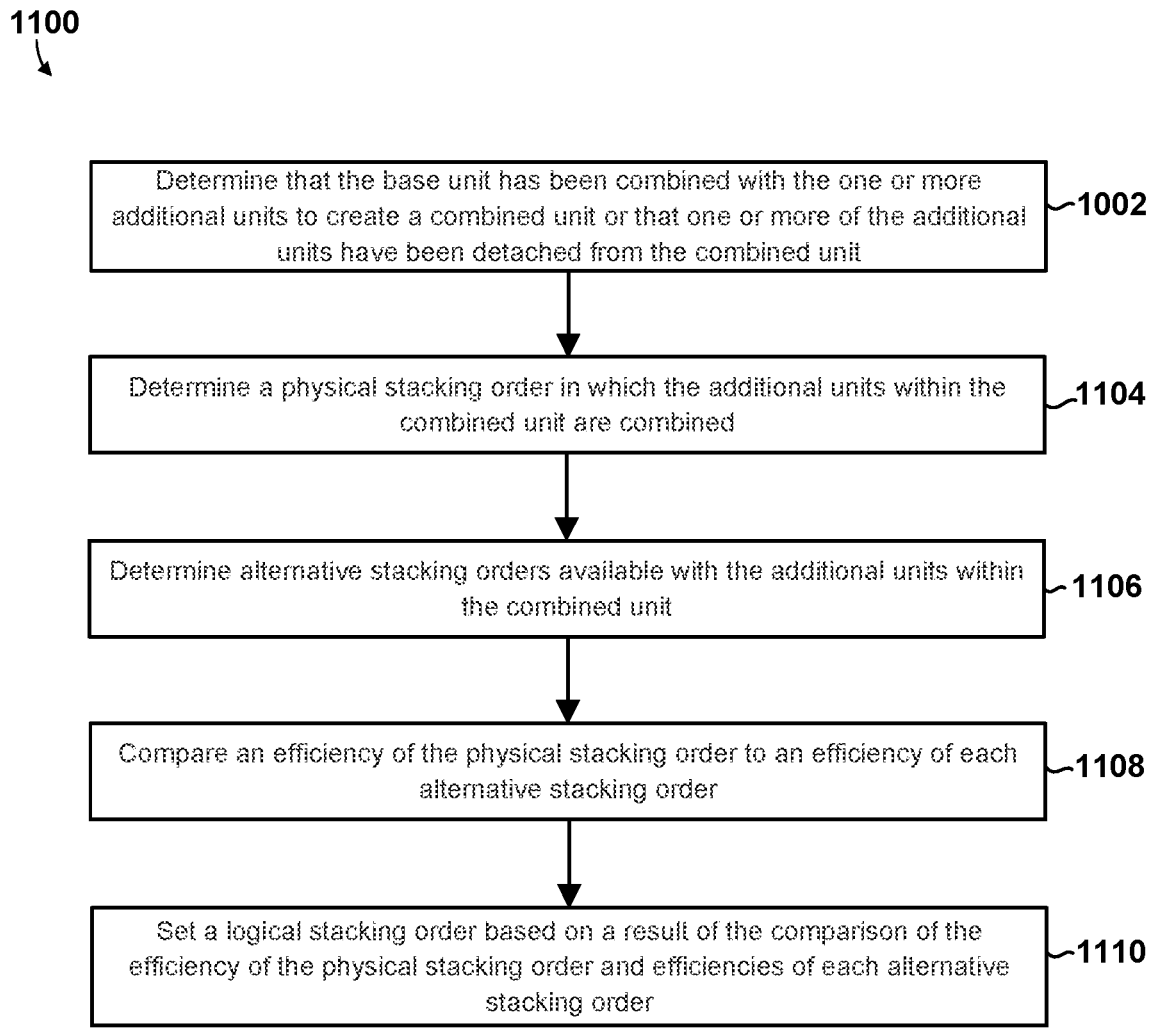

With reference to FIG. 11, in block 1104, the processor(s) may determine a physical stacking order in which the additional units within the combined unit are combined. In block 1106, the processor(s) may determine alternative stacking orders available with the additional units within the combined unit. In block 1108, the processor(s) may compare an efficiency of the physical stacking order to an efficiency of each alternative stacking order. In block 1110, the processor(s) may set a logical stacking order based on a result of the comparison of the efficiency of the physical stacking order and efficiencies of each alternative stacking order.

Figure 12:
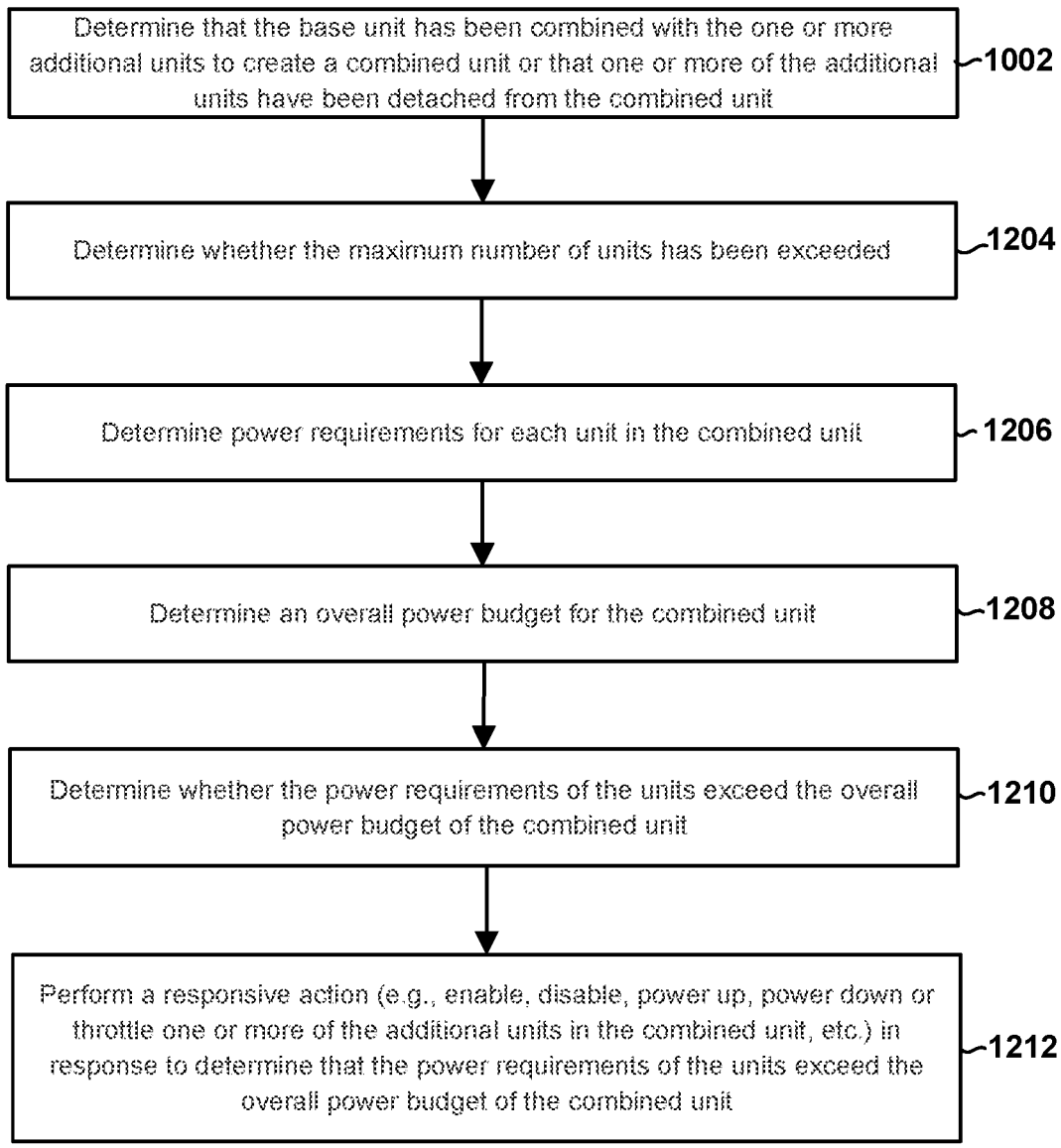

With reference to FIG. 12, in block 1204, the processor(s) may determine whether the maximum number of units has been exceeded (i.e., in response to determining in block 1002 that base unit has been combined with the one or more additional units, etc.). In block 1206, the processor(s) may determine power requirements for each unit in the combined unit. In block 1208, the processor(s) may determine an overall power budget for the combined unit. In block 1210, the processor(s) may determine whether the power requirements of the units exceed the overall power budget of the combined unit. In block 1212, the processor(s) may perform a responsive action (e.g., enable, disable, power up, power down or throttle one or more of the additional units in the combined unit, etc.) in response to determine that the power requirements of the units exceed the overall power budget of the combined unit.

Figure 13:
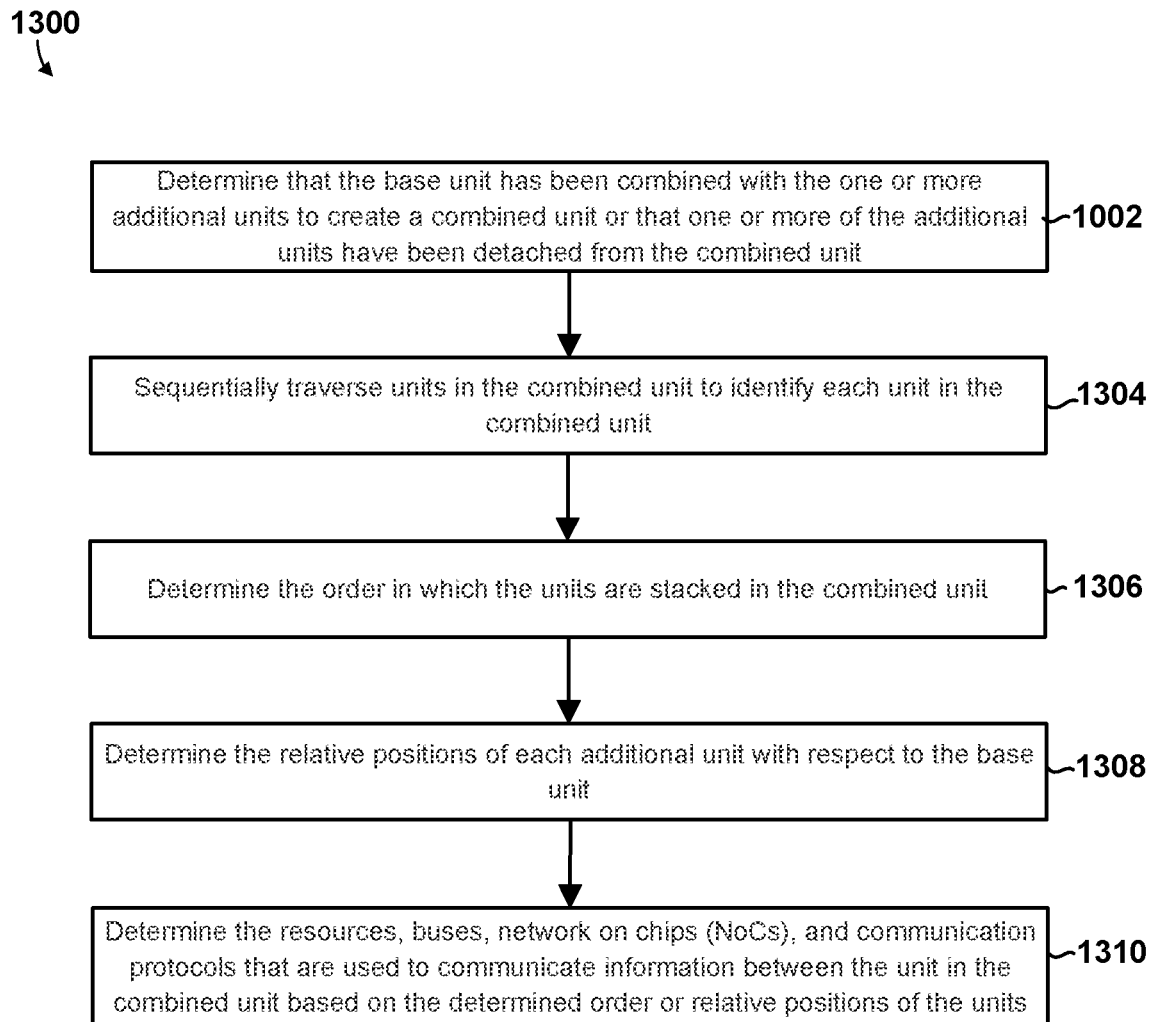

With reference to FIG. 13, in block 1304, the processor(s) may sequentially traverse units in the combined unit to identify each unit in the combined unit. In block 1306, the processor(s) may determine the order in which the units are stacked in the combined unit. In block 1308, the processor(s) may determine the relative positions of each additional unit with respect to the base unit. In block 1310, the processor(s) may determine the resources, buses, network on chips (NoCs), and communication protocols that are used to communicate information between the unit in the combined unit based on the determined order or relative positions of the units.

Figure 14:
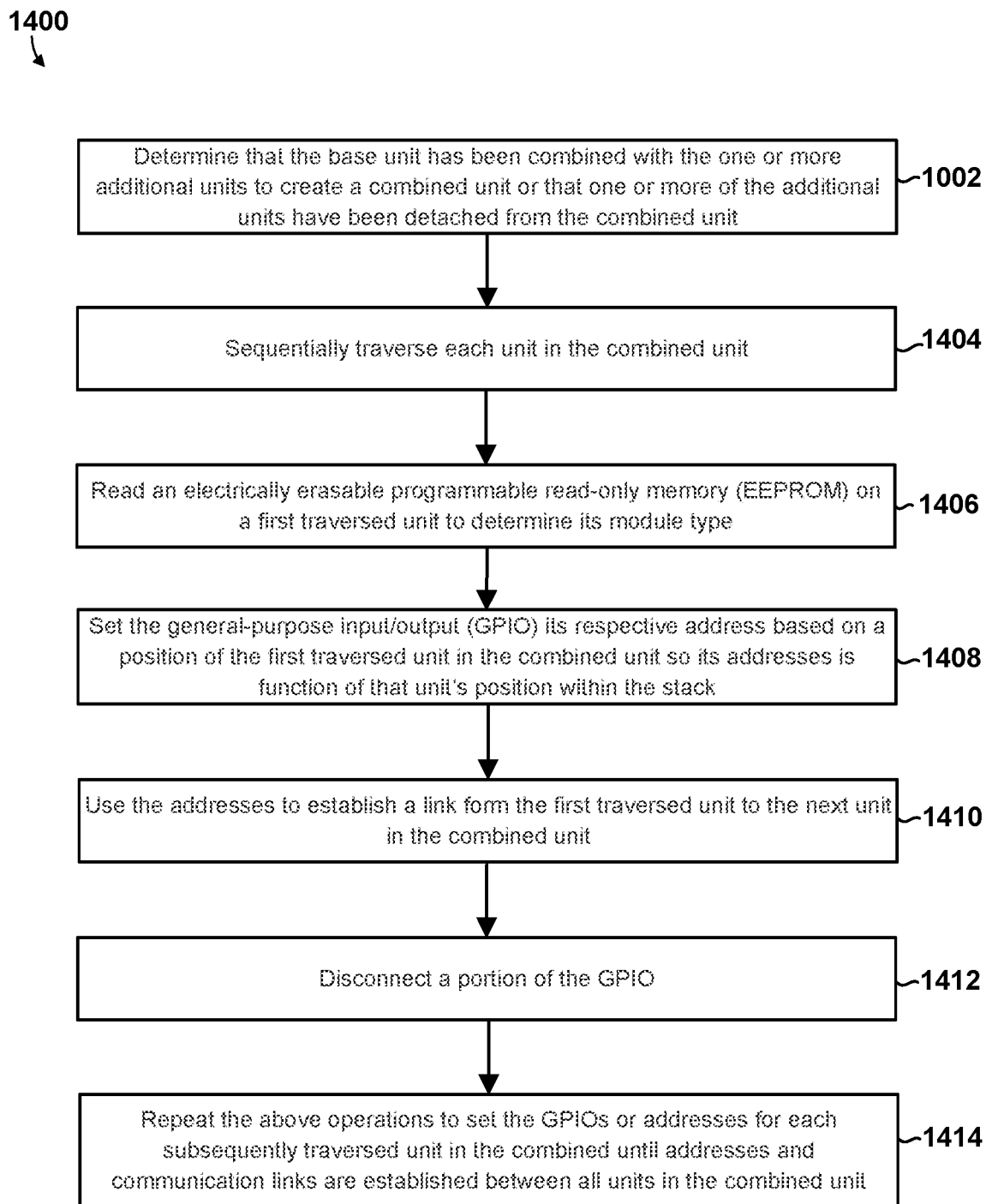

With reference to FIG. 14, in block 1404, the processor(s) may sequentially traverse each unit in the combined unit. In block 1406, the processor(s) may read an electrically erasable programmable read-only memory (EEPROM) on a first traversed unit to determine its module type. In block 1408, the processor(s) may set the general-purpose input/output (GPIO) its respective address based on a position of the first traversed unit in the combined unit so its addresses is function of that unit's position within the stack. In block 1410, the processor(s) may use the addresses to establish a link form the first traversed unit to the next unit in the combined unit. In block 1412, the processor(s) may disconnect a portion of the GPIO. In block 1414, the processor(s) may repeat the above operations to set the GPIOs or addresses for each subsequently traversed unit in the combined until addresses and communication links are established between all units in the combined unit.

Figure 15:
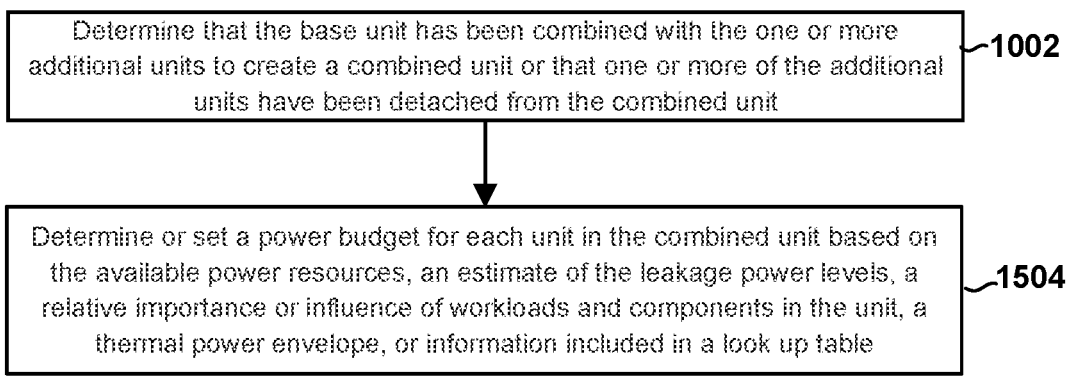

With reference to FIG. 15, in block 1504, the processor(s) may determine or set a power budget for each unit in the combined unit based on the available power resources, an estimate of the leakage power levels, a relative importance or influence of workloads and components in the unit, a thermal power envelope, and/or information included in a look up table in response to determining (e.g., in block 1002) that the base unit has been combined with the one or more additional units to create a combined unit or that one or more of the additional units have been detached from the combined unit.

Figure 16:
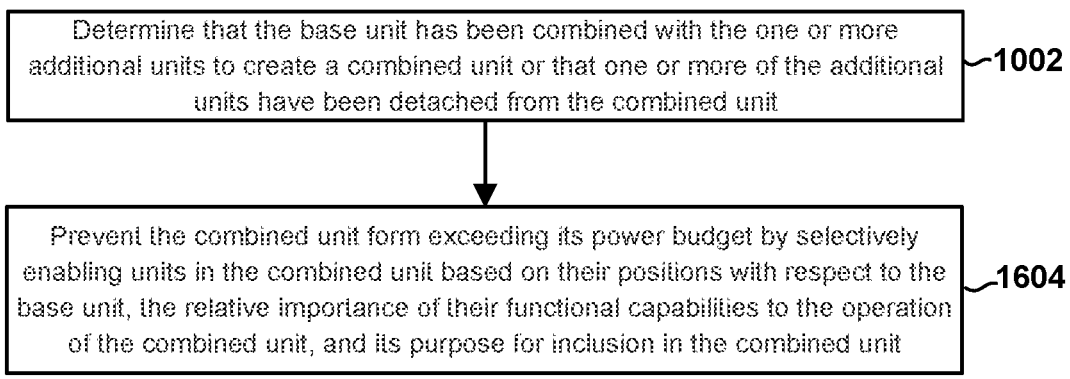

With reference to FIG. 16, in block 1604, the processor(s) may prevent the combined unit form exceeding its power budget by selectively enabling units in the combined unit based on their positions with respect to the base unit, the relative importance of their functional capabilities to the operation of the combined unit, and its purpose for inclusion in the combined unit. The operations in block 1604 may be performed in response to determining (e.g., in block 1002) that the base unit has been combined with the one or more additional units to create a combined unit or that one or more of the additional units have been detached from the combined unit.

Figure 17:
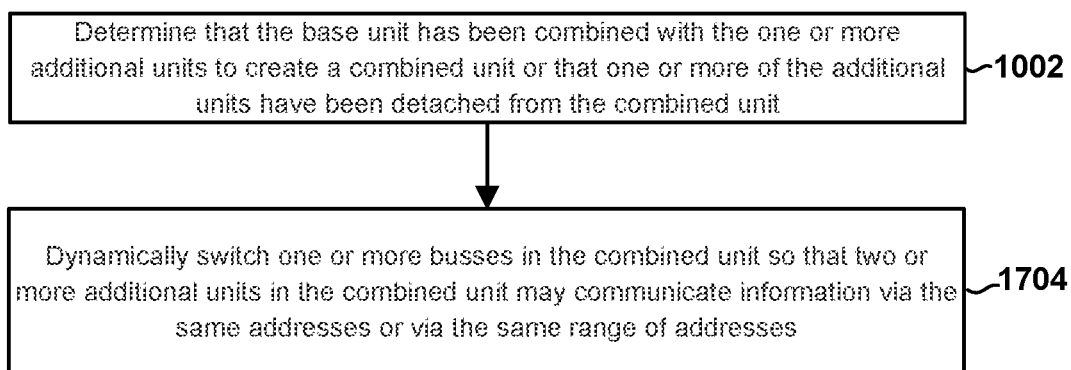

With reference to FIG. 17, in block 1704, the processor(s) may dynamically switch one or more busses in the combined unit so that two or more additional units in the combined unit may communicate information via the same addresses or via the same range of addresses in response to determining (e.g., in block 1002) that the base unit has been combined with the one or more additional units to create a combined unit or that one or more of the additional units have been detached from the combined unit.

Figure 18:
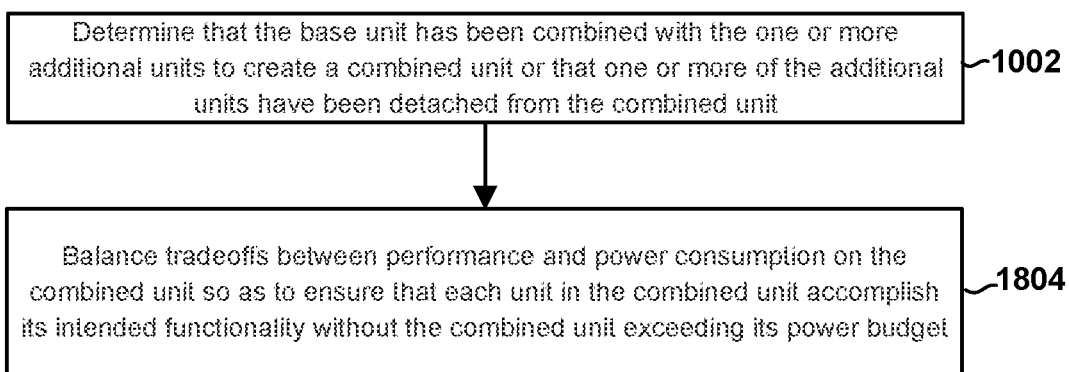

With reference to FIG. 18, in block 1804, the processor(s) may balance tradeoffs between performance and power consumption on the combined unit so as to ensure that each unit in the combined unit accomplish its intended functionality without the combined unit exceeding its power budget. The operations in block 1804 may be performed in response to determining (e.g., in block 1002) that the base unit has been combined with the one or more additional units to create a combined unit or that one or more of the additional units have been detached from the combined unit.

Figure 19:
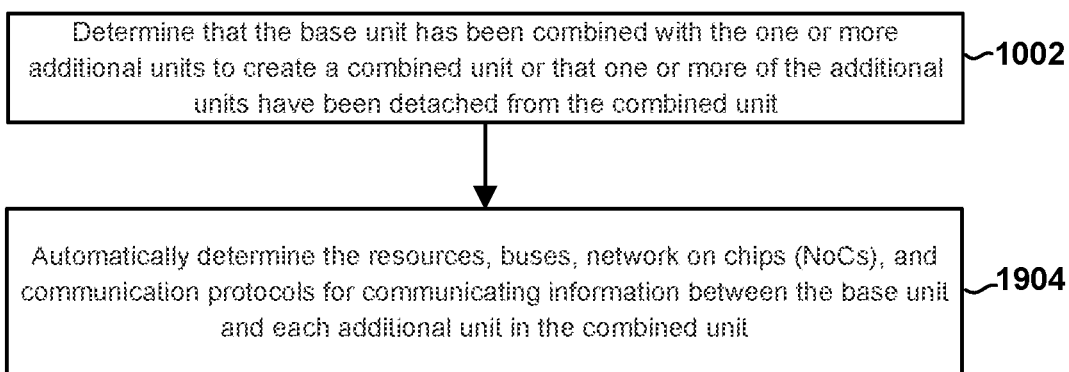

With reference to FIG. 19, in block 1904, the processor(s) may automatically determine the resources, buses, network on chips (NoCs), and communication protocols for communicating information between the base unit and each additional unit in the combined unit. The operations in block 1904 may be performed in response to determining (e.g., in block 1002) that the base unit has been combined with the one or more additional units to create a combined unit or that one or more of the additional units have been detached from the combined unit.

Figure 20:
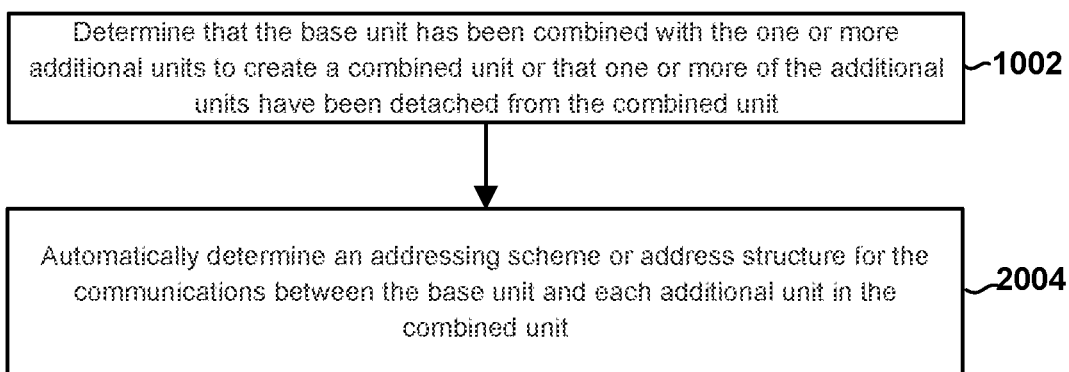

With reference to FIG. 20, in block 2004, the processor(s) may automatically determine an addressing scheme or address structure for the communications between the base unit and each additional unit in the combined unit. The operations in block 2004 may be performed in response to determining (e.g., in block 1002) that the base unit has been combined with the one or more additional units to create a combined unit or that one or more of the additional units have been detached from the combined unit.

Figure 21:
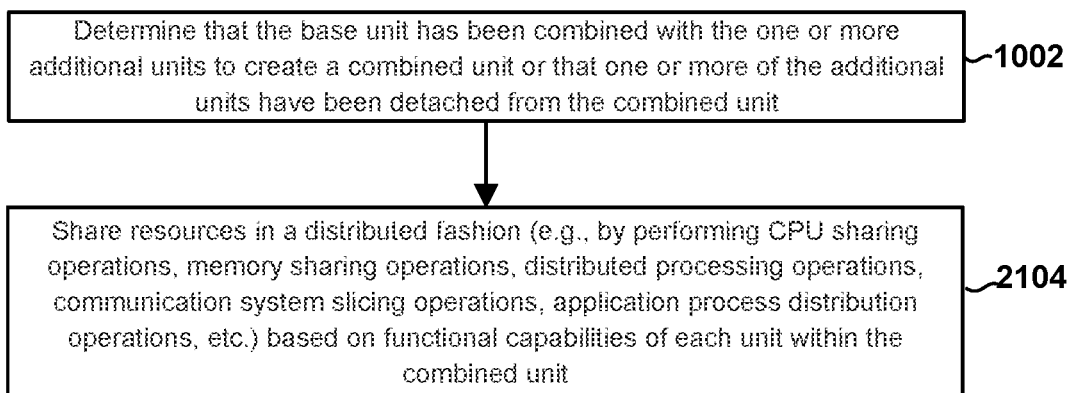

With reference to FIG. 21, in block 2104, the processor(s) may share resources in a distributed fashion (e.g., by performing CPU sharing operations, memory sharing operations, distributed processing operations, communication system slicing operations, application process distribution operations, etc.) based on functional capabilities of each unit within the combined unit. The operations in block 2104 may be performed in response to determining (e.g., in block 1002) that the base unit has been combined with the one or more additional units to create a combined unit or that one or more of the additional units have been detached from the combined unit.

Some embodiments may include a method of operating an edge device with an expandable architecture, which may include determining, by a processor in the edge device, whether a base unit in the edge device has been combined with one or more additional units to create a combined unit, determining, by the processor, whether one or more of the additional units have been detached from the combined unit, and performing, by the processor, an ERIE operation in response to determining that the base unit in the edge device has been combined with the one or more additional units to create the combined unit or in response to determining that one or more of the additional units have been detached from the combined unit.

In some embodiments the method may include identifying all of the additional units within the combined unit, verifying the compatibility of all the identified additional units with one another, determining a purpose for each of the identified additional units, determining one or more functional capabilities for each of the identified additional units, and identifying redundancies in the combined unit based on the determined purposes and determined functional capabilities of the identified additional units in response to determining that the base unit has been combined with the one or more additional units to create the combined unit, or in response to determining that one or more of the additional units have been detached from the combined unit.

In some embodiments, the method may further include eliminating identified redundancies in the combined unit.

In some embodiments, the method may include determining a physical stacking order in which the additional units within the combined unit are combined, determining alternative stacking orders available with the additional units within the combined unit, comparing an efficiency of the physical stacking order to an efficiency of each alternative stacking order, and setting a logical stacking order based on a result of the comparison of the efficiency of the physical stacking order and efficiencies of each alternative stacking order in response to determining that the base unit has been combined with the one or more additional units to create the combined unit, or in response to determining that one or more of the additional units have been detached from the combined unit.

In some embodiments, the method may include determining whether the maximum number of units has been exceeded, determining power requirements for each unit in the combined unit, determining an overall power budget for the combined unit, determining whether the power requirements of the units exceed the overall power budget of the combined unit, and performing a responsive action in response to determine that the power requirements of the units exceed the overall power budget of the combined unit in response to determining that the base unit has been combined with the one or more additional units to create the combined unit, or in response to determining that one or more of the additional units have been detached from the combined unit.

In some embodiments, the method may include performing the responsive action in response to determine that the power requirements of the units exceed the overall power budget of the combined unit includes performing the responsive action in response to determining that the power requirements of the units exceed the overall power budget of the combined unit by enabling, disabling, powering up, powering down or throttling one or more of the additional units in the combined unit.

In some embodiments, the method may include automatically determining the resources, buses, network on chips (NoCs), and communication protocols for communicating information between the base unit and each additional unit in the combined unit in response to determining that the base unit has been combined with the one or more additional units to create the combined unit, or in response to determining that one or more of the additional units have been detached from the combined unit.

In some embodiments, the method may include automatically determining an addressing scheme or address structure for the communications between the base unit and each additional unit in the combined unit in response to determining that the base unit has been combined with the one or more additional units to create the combined unit, or in response to determining that one or more of the additional units have been detached from the combined unit.

In some embodiments, the method may include sharing resources in a distributed fashion based on functional capabilities of each unit within the combined unit. In some embodiments, sharing the resources in the distributed fashion may include performing CPU sharing operations, performing memory sharing operations, performing distributed processing operations, performing communication system slicing operations, or performing application process distribution operations.

In some embodiments, the method may include sequentially traversing units in the combined unit to identify each unit in the combined unit, determining the order in which the units are stacked in the combined unit, determining the relative positions of each additional unit with respect to the base unit, and determining the resources, buses, network on chips (NoCs), and communication protocols that are used to communicate information between the unit in the combined unit based on the determined order or relative positions of the units in response to determining that the base unit has been combined with the one or more additional units to create the combined unit, or in response to determining that one or more of the additional units have been detached from the combined unit.

In some embodiments, determining the resources, buses, NoCs, and communication protocols that are used to communicate information between the unit in the combined unit based on the determined order or relative positions of the units may include assigning higher speed modules (e.g., PCIe, etc.) to be used by units that are closer to the base unit, and assigning lower speed modules (e.g., SGMII, etc.) to those that are further from the base unit.

In some embodiments, determining the resources, buses, network NoCs, and communication protocols that are used to communicate information between the unit in the combined unit based on the determined order or relative positions of the units may include assigning available PCIe modules to be used by units that are closer to the base unit, and assigning a serial gigabit media-independent interface (SGMII) to units further from the base unit after assigning all the available PCIe modules.

In some embodiments, the method may include dynamically switching one or more busses in the combined unit so that two or more additional unit may use the same addresses or the same range of addresses to communicate information in response to determining that the base unit has been combined with the one or more additional units to create the combined unit, or in response to determining that one or more of the additional units have been detached from the combined unit.

In some embodiments, the method may include sequentially traversing each unit in the combined unit, reading an electrically erasable programmable read-only memory (EEPROM) on a first traversed unit to determine its module type, setting the general-purpose input/output (GPIO) its respective address based on a position of the first traversed unit in the combined unit so its addresses is a function of that unit's position within the stack, using the addresses to establish a link form the first traversed unit to the next unit in the combined unit, disconnecting a portion of the GPIO, and repeating the operations above to set the GPIOs or addresses for each subsequently traversed unit until addresses and communication links are established between all units in the combined unit in response to determining that the base unit has been combined with the one or more additional units to create the combined unit, or in response to determining that one or more of the additional units have been detached from the combined unit.

In some embodiments, the method may include determining or setting a power budget for each unit in the combined unit based on the available power resources, an estimate of the leakage power levels, a relative importance or influence of workloads and components in the unit, a thermal power envelope, or information included in a look up table in response to determining that the base unit has been combined with the one or more additional units to create the combined unit, or in response to determining that one or more of the additional units have been detached from the combined unit.

In some embodiments, the method may include balancing tradeoffs between performance and power consumption on the combined unit so as to ensure that each unit in the combined unit accomplish its intended functionality without the combined unit exceeding its power budget in response to determining that the base unit has been combined with the one or more additional units to create the combined unit, or in response to determining that one or more of the additional units have been detached from the combined unit.

In some embodiments, the method may include preventing the combined unit form exceeding its power budget by selectively enabling units in the combined unit based on their positions with respect to the base unit, the relative importance of their functional capabilities to the operation of the combined unit, and its purpose for inclusion in the combined unit in response to determining that the base unit has been combined with the one or more additional units to create the combined unit or in response to determining that one or more of the additional units have been detached from the combined unit.

Some embodiments may include a modular wireless communications system (edge device, etc.) that includes a baseline feature set and an expandable architecture that allows end users to add specific features or functionality (e.g., digital concierge, home assistant, etc.) to the device as needed. In some embodiments, the modular wireless communications system may include a base unit and one or more additional units.

In some embodiments, the base unit and the one or more additional units may operate independently and may be combined to operate as a single unified device. In some embodiments, the base unit and/or the one or more additional units may include a processor configured so that, when the units are combined (e.g., when first stacked, upon detecting the addition or removal of a component or unit to the combined unit, etc.), the processor(s) automatically performs an edge reconfiguration interrogation and enumeration (ERIE) operation.

In some embodiments, the base unit and/or the one or more additional units may include a processor configured so that, when the units are combined to form a combined unit, the processor(s) perform operations that include identifying all the components/units within the combined unit, verifying the compatibility of all the components/units with one another, determining the purpose or functional capabilities of each unit in the combined unit, identifying and eliminating redundant components/units in the combined unit, determining whether all the units in the combined unit are stacked or combined properly, determining whether the physical order in which the units are stacked or combined is efficient (e.g., the most efficient order, etc.), determining whether the maximum number of units has been exceeded, determining power requirements for each unit in the combined unit, determining an overall power budget for the combined unit, determining whether the power requirements of the units exceed the overall power budget of the combined unit, enabling, disabling, powering up, powering down or throttling individual units in the combined unit, determining the resources, buses, NoCs, and communication protocols that should be used to communicate information between the unit in the combined unit, or determining an addressing scheme or address structure for the communications between the units.

In some embodiments, the base unit and/or the one or more additional units may include a processor configured so that, when the units are combined to form a combined unit, the processor(s) perform operations that include sharing resources in a distributed fashion in response to determining the purpose or functional capabilities of each unit in the combined unit.

In some embodiments, sharing the resources in the distributed fashion in response to determining the purpose or functional capabilities of each unit in the combined unit comprises at least one of performing CPU sharing operations, performing memory sharing operations, performing distributed processing operations, performing communication system slicing operations, or performing application process distribution operations.

In some embodiments, the base unit and/or the one or more additional units may include a processor configured so that, when the units are combined to form a combined unit, the processor(s) perform operations that include determining that the units have be combined or that the combined unit has been modified, sequentially traversing the units in the stacked or combined unit to identify each unit in the combined unit, determining the order in which the units are stacked/combined in the combined unit or determining their relative positions in the stack/combination with respect to the base unit, and determining the resources, buses, NoCs, and communication protocols that are used to communicate information between the unit in the combined unit based on the order or relative positions of the units.

In some embodiments, determining the resources, buses, NoCs, and communication protocols that are used to communicate information between the unit in the combined unit based on the order or relative positions of the units comprises assigning higher speed modules (e.g., PCIe, etc.) to be used by units that are closer to the base unit, and assigning lower speed modules (e.g., SGMII, etc.) to those that are further from the base unit.

In some embodiments, the base unit and/or the one or more additional units may include a processor configured so that, when the units are combined to form a combined unit, the processor(s) perform operations that include dynamically switching one or busses in the combined unit so that two or more components/unit may use the same addresses (or range of addresses) to communicate information.

In some embodiments, the base unit and/or the one or more additional units may include a processor configured so that, when the units are combined to form a combined unit, the processor(s) perform operations that include sequentially traversing each unit in the combined unit, reading the EEPROM on the first traversed unit to determine its module type, setting the GPIOs or their respective addresses (e.g., I$^2$C addresses, etc.) based on the unit's position in the combined unit (i.e., so that the addresses are a function of the unit's position within the stack), using the addresses to establish a link to the next unit in the combined unit, disconnecting a portion of the GPIOs or bus (set it and forget it), and repeating the operations above to set the GPIOs or addresses for each subsequently traversed unit until addresses and communication links are assigned/established between all the units in the combined unit.

In some embodiments, the base unit and/or the one or more additional units may include a processor configured so that, when the units are combined to form a combined unit, the processor(s) perform operations that include determining or setting a power budget (e.g., in units proportional to Watts, etc.) for each individual unit and/or for the combined unit based on the available power resources, an estimate of the leakage power levels, relative importance or influence of workloads and components in the unit, thermal power envelopes, or information included in a look up table.

In some embodiments, the base unit and/or the one or more additional units may include a processor configured so that, when the units are combined to form a combined unit, the processor(s) perform operations that include sending a warning to a user and/or selecting a larger power supply in response to determining that that power requirements of the components/units (e.g., power required for the components to operate or accomplish their intended functionality) exceed the power budget of the combined unit.

In some embodiments, the base unit and/or the one or more additional units may include a processor configured so that, when the units are combined to form a combined unit, the processor(s) perform operations that include throttling or temporarily reducing power to a unit (or to some of the components within a unit) or throttle the processing clock frequency of one or more processing components to ensure that the combined unit does not exceed the power budget.

In some embodiments, the base unit and/or the one or more additional units may include a processor configured so that, when the units are combined to form a combined unit, the processor(s) perform operations that include balancing tradeoffs between performance and power consumption on the combined unit so as to ensure that each unit may accomplish its intended functionality without the combined unit exceeding the power budget.

In some embodiments, the base unit and/or the one or more additional units may include a processor configured so that, when the units are combined to form a combined unit, the processor(s) perform operations that include selectively enabling the units in the combined unit based on their positions with respect to the base unit, the relative importance of their functional capabilities to the operation of the combined unit, their purpose for inclusion in the combined unit so as to ensure that the combined unit does not exceed its power budget.

The processors or processing units described in this application (e.g., the processors 408-414 of the modular wireless communications system, etc.) may be any programmable microprocessor, microcomputer or multiple processor chip or chips that can be configured by software instructions (applications) to perform a variety of functions, including the functions of the various aspects described in this application. In some wireless devices, multiple processors may be provided, such as one processor dedicated to wireless communication functions and one processor dedicated to running other applications. Typically, software applications may be stored in the internal memory before they are accessed and loaded into the processor. The processor may include internal memory sufficient to store the application software instructions.

A number of different types of memories and memory technologies are available or contemplated in the future, any or all of which may be included and used in systems and computing devices that implement the various embodiments. Such memory technologies/types may include non-volatile random-access memories (NVRAM) such as Magnetoresistive RAM (M-RAM), resistive random access memory (ReRAM or RRAM), phase-change random-access memory (PC-RAM, PRAM or PCM), ferroelectric RAM (F-RAM), spin-transfer torque magnetoresistive random-access memory (STT-MRAM), and three-dimensional cross point (3D-XPOINT) memory. Such memory technologies/types may also include non-volatile or read-only memory (ROM) technologies, such as programmable read-only memory (PROM), field programmable read-only memory (FPROM), one-time programmable non-volatile memory (OTP NVM). Such memory technologies/types may further include volatile random-access memory (RAM) technologies, such as dynamic random-access memory (DRAM), double data rate (DDR) synchronous dynamic random-access memory (DDR SDRAM), static random-access memory (SRAM), and pseudostatic random-access memory (PSRAM). Systems and computing devices that implement the various embodiments may also include or use electronic (solid-state) non-volatile computer storage mediums, such as FLASH memory. Each of the above-mentioned memory technologies include, for example, elements suitable for storing instructions, programs, control signals, and/or data for use in or by a computer or other digital electronic device. Any references to terminology and/or technical details related to an individual type of memory, interface, standard or memory technology are for illustrative purposes only, and not intended to limit the scope of the claims to a particular memory system or technology unless specifically recited in the claim language.

As used in this application, the terms "component," "module," "system," and the like may refer to a computer-related entity, such as, but not limited to, hardware, firmware, a combination of hardware and software, software, or software in execution, which are configured to perform particular operations or functions. For example, a component may be, but is not limited to, a process running on a processor, a processor, an object, an executable, a thread of execution, a program, and/or a computer. By way of illustration, both an application running on a wireless device and the wireless device may be referred to as a component. One or more components may reside within a process and/or thread of execution and a component may be localized on one processor or core and/or distributed between two or more processors or cores. In addition, these components may execute from various non-transitory computer readable media having various instructions and/or data structures stored thereon. Components may communicate by way of local and/or remote processes, function or procedure calls, electronic signals, data packets, memory read/writes, and other known network, computer, processor, and/or process related communication methodologies.

As used in this application, the term "runtime system" may refer to a combination of software and/or hardware resources in a computing device (e.g., the modular wireless communications system, etc.) that support the execution of an application program in that device. For example, a runtime system may include all or portions of the computing device's processing resources, operating systems, library modules, schedulers, processes, threads, stacks, counters, and/or other similar components. A runtime system may be responsible for allocating computational resources to an application program, for controlling the allocated resources, and for performing the operations of the application program.

In some embodiments, the modular wireless communications system may include a parallel programming runtime system. A parallel programming runtime system is a runtime system that supports concurrent/parallel execution of all or portions of one or more application programs. Modern parallel programming runtime systems allow software designers to create high-performance parallel application programs that better exploit the concurrency and/or parallelism capabilities of modern processor architectures. A software designer may specify the portions of an application program that are to be executed (such as a programmer-specified C/C++ function) by the parallel programming runtime system. The runtime system may execute or perform the portions in one or more hardware processing units (e.g., a processor or processing core, such as the applications processor 414 of the modular wireless communications system, etc.) via processes, threads, or tasks.

In some embodiments, the modular wireless communications system (or its processors) may be configured to execute processes. A process may be a software representation of an application program in the computing device. Processes may be executed on a processor in short time slices so that it appears that multiple application programs are running simultaneously on the same processor (e.g., by using time-division multiplexing techniques), such as a single-core processor. When a process is removed from a processor at the end of a time slice, information pertaining to the current operating state of the process (i.e., the process's operational state data) is stored in memory so the process may seamlessly resume its operations when it returns to execution on the processor. A process's operational state data may include the process's address space, stack space, virtual address space, register set image (e.g. program counter, stack pointer, instruction register, program status word, etc.), accounting information, permissions, access restrictions, and state information. The state information may identify whether the process is in a running state, a ready or ready-to-run state, or a blocked state. A process is in the ready-to-run state when all of its dependencies or prerequisites for execution have been met (e.g., memory and resources are available, etc.), and is waiting to be assigned to the next available processing unit. A process is in the running state when its procedure is being executed by a processing unit. A process is in the blocked state when it is waiting for the occurrence of an event (e.g., input/output completion event, etc.).

A process may spawn other processes, and the spawned process (i.e., a child process) may inherit some of the permissions and access restrictions (i.e., context) of the spawning process (i.e., the parent process). A process may also be a heavy-weight process that includes multiple light-weight processes or threads, which are processes that share all or portions of their context (e.g., address space, stack, permissions and/or access restrictions, etc.) with other processes/threads. Thus, a single process may include multiple threads that share, have access to, and/or operate within a single context (e.g., a processor, process, or application program's context).

The modular wireless communications system may be multiprocessor system that is configured to execute multiple threads concurrently or in parallel to improve a process's overall execution time. In addition, an application program, operating system, runtime system, scheduler, or another component in the modular wireless communications system may be configured to create, destroy, maintain, manage, schedule, or execute threads based on a variety of factors or considerations. For example, to improve parallelism, the modular wireless communications system may be configured to create a thread for every sequence of operations that could be performed concurrently with another sequence of operations.

Generally, application programs that maintain a large number of idle threads, or frequently destroy and create new threads, may have a significant negative or user-perceivable impact on the responsiveness, performance, or power consumption characteristics of the modular wireless communications system. Therefore, in some embodiments, an application program may implement or use a task-parallel programming model or solution that provides adequate levels of parallelism without requiring the creation or maintenance of a large number of threads. Such solutions allow the modular wireless communications system to split the computation of an application program into tasks, assign the tasks to the thread pool that maintains a near-constant number of threads (e.g., one for each processing unit), and execute assigned tasks via the threads of the thread pool.

A task may include any procedure, unit of work, or sequence of operations that may be executed in a processing unit via a thread. A task may include state information that identifies whether the task is launched, ready, blocked, or finished. A task is in the launched state when it has been assigned to a thread pool and is waiting for a predecessor task to finish execution and/or for other dependencies or prerequisites for execution to be met. A task is in the ready state when all of its dependencies or prerequisites for execution have been met (e.g., all of its predecessors have finished execution), and is waiting to be assigned to the next available thread. A task is in the blocked state when it (or its associated thread) is waiting on a dependency to be resolved, a resource to become available, a system call to return, a response to system request, etc. A task may be marked as finished after its procedure has been executed by a thread or after being canceled.

A process scheduler or runtime system of the modular wireless communications system may schedule tasks for execution on the processing units, similar to how processes and threads may be scheduled for execution. The parallel programming runtime system of the modular wireless communications system may execute or perform a portion of an application program by launching or executing tasks. During execution, each task may invoke system calls to request information from an entity that is external to, or outside the scope of, the application program or the runtime system.

Various aspects illustrated and described are provided merely as examples to illustrate various features of the claims. However, features shown and described with respect to any given aspect are not necessarily limited to the associated aspect and may be used or combined with other aspects that are shown and described. Further, the claims are not intended to be limited by any one example aspect. For example, one or more of the operations of the methods may be substituted for or combined with one or more operations of the methods.

The foregoing method descriptions and the process flow diagrams are provided merely as illustrative examples and are not intended to require or imply that the operations of various aspects must be performed in the order presented. As will be appreciated by one of skill in the art the order of operations in the foregoing aspects may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

Various illustrative logical blocks, modules, components, circuits, and algorithm operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such aspect decisions should not be interpreted as causing a departure from the scope of the claims.

The hardware used to implement various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed aspects is provided to enable any person skilled in the art to make or use the claims. Various modifications to these aspects will be readily apparent to those skilled in the art, and the generic principles defined herein may be applied to other aspects without departing from the scope of the claims. Thus, the present disclosure is not intended to be limited to the aspects shown herein but is to be accorded the widest scope consistent with the following claims and the principles and novel features disclosed herein.

What is claimed is:

1. A modular wireless communications system, comprising:
   a base unit comprising a base unit processor; and
   one or more additional units that each comprise a processor, wherein the base unit processor is configured with processor-executable software instructions to:
      determine whether the base unit has been combined with the one or more additional units to create a combined unit;
      determine whether one or more of the additional units have been detached from the combined unit;
      identify the one or more additional units that are currently included in the combined unit in response to determining the base unit has been combined with the one or more additional units to create the combined unit or in response to determining that at least one of the one or more of the additional units have been detached from the combined unit;
      determine a purpose for each of the identified additional units;
      determine one or more functional capabilities for each of the identified additional units;
      identify redundancies in the combined unit based on the determined purposes and determined functional capabilities of the identified additional units; and
      eliminate identified redundancies in the combined unit.

2. The modular wireless communications system of claim 1, wherein the base unit processor is further configured to verify the compatibility of all the identified additional units with one another.

3. The modular wireless communications system of claim 1, wherein the base unit processor is further configured to determine whether the maximum number of units has been exceeded in response to determining the base unit has been combined with the one or more additional units.

4. The modular wireless communications system of claim 1, wherein the base unit processor is further configured to determine power requirements for each of the identified additional units.

5. The modular wireless communications system of claim 4, wherein the base unit processor is further configured to determine an overall power budget for the combined unit.

6. The modular wireless communications system of claim 5, wherein the base unit processor is further configured to determine whether the power requirements of the units exceed the overall power budget of the combined unit.

7. The modular wireless communications system of claim 6, wherein the base unit processor is further configured to perform a responsive action in response to determine that the power requirements of the units exceed the overall power budget of the combined unit.

8. The modular wireless communications system of claim 7, wherein the base unit processor is further configured to perform the responsive action by:
   enabling one or more of identified additional units;
   disabling one or more of identified additional units;
   powering up one or more of identified additional units;
   power down one or more of identified additional units; or
   throttling one or more of the identified additional units.

9. The modular wireless communications system of claim 1, wherein in response to determining that the base unit has been combined with the one or more additional units to create the combined unit, or in response to determining that one or more of the additional units have been detached from the combined unit, the base unit processor performs operations that include:
- sequentially traversing each unit in the combined unit;
- reading an electrically erasable programmable read-only memory (EEPROM) on a first traversed unit to determine its module type;
- setting the general-purpose input/output (GPIO) its respective address based on a position of the first traversed unit in the combined unit so its addresses is function of that unit's position within the stack;
- using the addresses to establish a link form the first traversed unit to the next unit in the combined unit;
- disconnecting a portion of the GPIO; and
- repeating the operations above to set the GPIOs or addresses for each subsequently traversed unit until addresses and communication links are established between all units in the combined unit.

10. The modular wireless communications system of claim 1, wherein in response to determining that the base unit has been combined with the one or more additional units to create the combined unit, or in response to determining that one or more of the additional units have been detached from the combined unit, the base unit processor performs operations that include:
- sequentially traversing units in the combined unit to identify each unit in the combined unit;
- determining the order in which the units are stacked in the combined unit;
- determining the relative positions of each additional unit with respect to the base unit; and
- determining the resources, buses, network on chips (NoCs), and communication protocols that are used to communicate information between the unit in the combined unit based on the determined order or relative positions of the units.

11. A method of operating an edge device with an expandable architecture, comprising:
- determining, by a processor in the edge device, whether the base unit has been combined with the one or more additional units to create a combined unit;
- determining, by the processor, whether one or more of the additional units have been detached from the combined unit;
- identifying, by the processor, the one or more additional units that are currently included in the combined unit in response to determining the base unit has been combined with the one or more additional units to create the combined unit or in response to determining that at least one of the one or more of the additional units have been detached from the combined unit;
- determining, by the processor, a purpose for each of the identified additional units;
- determining, by the processor, one or more functional capabilities for each of the identified additional units;
- identifying, by the processor, redundancies in the combined unit based on the determined purposes and determined functional capabilities of the identified additional units; and
- eliminating, by the processor, identified redundancies in the combined unit.

12. The method of claim 11, wherein the base unit processor is further configured to verify the compatibility of all the identified additional units with one another.

13. The method of claim 11, wherein the base unit processor is further configured to determine whether the maximum number of units has been exceeded in response to determining the base unit has been combined with the one or more additional units.

14. The method of claim 11, wherein the base unit processor is further configured to determine power requirements for each of the identified additional units.

15. The method of claim 14, wherein the base unit processor is further configured to determine an overall power budget for the combined unit.

16. The method of claim 15, wherein the base unit processor is further configured to determine whether the power requirements of the units exceed the overall power budget of the combined unit.

17. The method of claim 16, wherein the base unit processor is further configured to perform a responsive action in response to determine that the power requirements of the units exceed the overall power budget of the combined unit.

18. The method of claim 17, wherein the base unit processor is further configured to perform the responsive action by:
- enabling one or more of identified additional units;
- disabling one or more of identified additional units;
- powering up one or more of identified additional units;
- power down one or more of identified additional units; or
- throttling one or more of the identified additional units.

19. The method of claim 11, wherein in response to determining that the base unit has been combined with the one or more additional units to create the combined unit, or in response to determining that one or more of the additional units have been detached from the combined unit, the base unit processor performs operations that include:
- sequentially traversing each unit in the combined unit;
- reading an electrically erasable programmable read-only memory (EEPROM) on a first traversed unit to determine its module type;
- setting the general-purpose input/output (GPIO) its respective address based on a position of the first traversed unit in the combined unit so its addresses is function of that unit's position within the stack;
- using the addresses to establish a link form the first traversed unit to the next unit in the combined unit;
- disconnecting a portion of the GPIO; and
- repeating the operations above to set the GPIOs or addresses for each subsequently traversed unit until addresses and communication links are established between all units in the combined unit.

20. The method of claim 11, wherein in response to determining that the base unit has been combined with the one or more additional units to create the combined unit, or in response to determining that one or more of the additional units have been detached from the combined unit, the base unit processor performs operations that include:
- sequentially traversing units in the combined unit to identify each unit in the combined unit;
- determining the order in which the units are stacked in the combined unit;
- determining the relative positions of each additional unit with respect to the base unit; and
- determining the resources, buses, network on chips (NoCs), and communication protocols that are used to communicate information between the unit in the combined unit based on the determined order or relative positions of the units.

* * * * *